United States Patent [19]
Guckel et al.

[11] Patent Number: 5,908,719
[45] Date of Patent: Jun. 1, 1999

[54] RADIATION MASK ADAPTED TO BE ALIGNED WITH A PHOTORESIST LAYER AND METHOD OF MAKING THE SAME

[75] Inventors: Henry Guckel, Madison, Wis.; Harald Emmerich, Mutlangen, Germany; Jonathan L. Klein, Madison, Wis.

[73] Assignee: Wisconsin Alumni Research Foundation, Madison, Wis.

[21] Appl. No.: 09/151,922

[22] Filed: Sep. 11, 1998

Related U.S. Application Data

[62] Division of application No. 08/753,645, Nov. 27, 1996, abandoned.

[51] Int. Cl.$^6$ .............................. G03F 5/00; G03F 9/00
[52] U.S. Cl. .................................. 430/5; 430/22
[58] Field of Search ..................... 430/5, 22, 30

[56] References Cited

U.S. PATENT DOCUMENTS

| | | | |
|---|---|---|---|
| 5,189,777 | 3/1993 | Guckel et al. | 29/424 |
| 5,190,637 | 3/1993 | Guckel | 205/118 |
| 5,206,983 | 5/1993 | Guckel et al. | 29/598 |
| 5,327,033 | 7/1994 | Guckel et al. | 310/42 |
| 5,357,807 | 10/1994 | Guckel et al. | 73/721 |
| 5,378,583 | 1/1995 | Guckel et al. | 430/325 |
| 5,496,668 | 3/1996 | Guckel et al. | 430/9 |
| 5,644,177 | 7/1997 | Guckel et al. | 310/42 |
| 5,718,618 | 2/1998 | Guckel et al. | 451/41 |

FOREIGN PATENT DOCUMENTS

WO 96/28829  9/1996  WIPO.

OTHER PUBLICATIONS

E.W. Becker, et al., "Fabrication of microstructures with high aspect ratios and great structural heights by synchrotron radiation lithography, galvanoforming, and plastic moulding (LIGA process)", Microelectronic Engineering 4, pp. 35–56, 1986.

W. Ehrfeld, et al., "LIGA Process: Sensor Construction Techniques via X–Ray Lithography", Technical Digest, IEEE Solid State Sensor and Actuator Workshop, Hilton Head, S.C., Jun. 6–9, 1988, pp. 1–4.

P. Hagmann & W. Ehrfeld, "Fabrication of Microstructures of Extreme Structural Heights by Reaction Injection Molding", International Polymer Processing IV, vol. 3, pp. 188–195, 1989.

H. Guckel, et al., "Deep X–Ray and UV Lithographies for Micromechanics", Technial Digest, Solid State Sensor and Actuator Workshop, Hilton Head, SC.., Jun. 4–7, 1990, pp. 118–122.

H. Guckel, et al., "Fabrication of Assembled Micromechanial Components Via Deep X-ray Lithography", Proc. IEEE Micro Electro Mech. Sys, Nara, Japan, Jan. 30–Feb. 2, 1991, pp. 74–79.

H. Guckel, et al., "Fabrication and testing of the planar magnetic micromotor", J. Micromech. Microeng., vol. 1, pp. 135–138, 1991.

H. Guckel, et al., "Processing and Design Considerations for High Force Output–Large Throw Electrostatic, Linear Micro Actuators", Actuator 94, Bremen, Germany, Jun. 15–17, 1994, pp. 1–4.

T.R. Christenson, et al., "An Electromagnetic Micro Dynamometer", 1995 IEEE MEMS Proeedings, Amsterdam, the Netherlands, Jan. 29–Feb. 2, 1995, pp. 386–391.

S. Massoud–Ansari, et al., "A Multi–Level, LIGA–Like Process for Three Dimensional Actuators", 1996 IEEE MEMS Proceedings, San Diego, California, Feb., 1996, pp. 285–289.

*Primary Examiner*—Christopher G. Young
*Attorney, Agent, or Firm*—Foley & Lardner

[57] ABSTRACT

The present invention provides a procedure for achieving accurate alignment between an X-ray mask and a device substrate for the fabrication of multi-layer microstructures. A first photoresist layer on the substrate is patterned by a first X-ray mask to include first alignment holes along with a first layer microstructure pattern. Mask photoresist layers are attached to second and subsequent masks that are used to pattern additional photoresist layers attached to the microstructure device substrate. The mask photoresist layers are patterned to include mask alignment holes that correspond in geometry to the first alignment holes in the first photoresist layer on the device substrate. Alignment between a second mask and the first photoresist layer is achieved by assembly of the second mask onto the first photoresist layer using alignment posts placed in the first alignment holes in the first photoresist layer that penetrate into the mask alignment holes in the mask photoresist layers. The alignment procedure is particularly applicable to the fabrication of multilayer metal microstructures using deep X-ray lithography and electroplating. The alignment procedure may be extended to multiple photoresist layers and larger device heights using spacer photoresist sheets between subsequent masks and the first photoresist layer that are joined together using alignment posts.

9 Claims, 9 Drawing Sheets

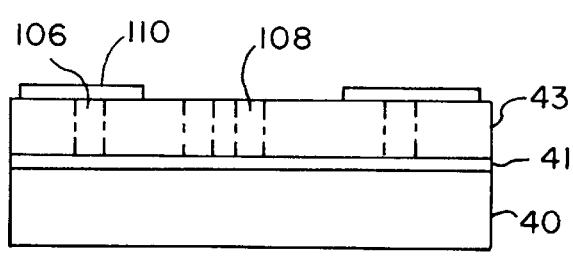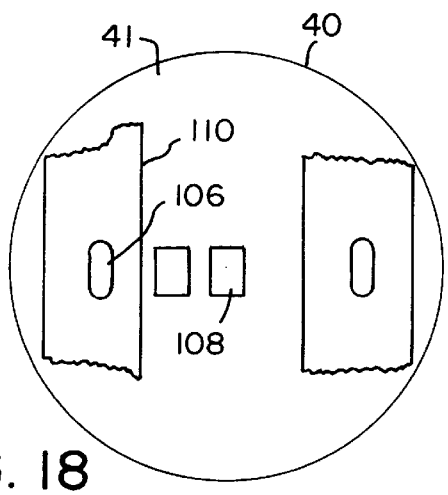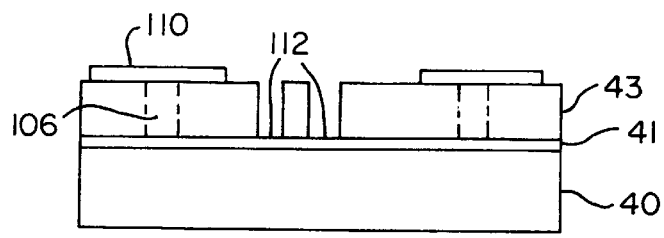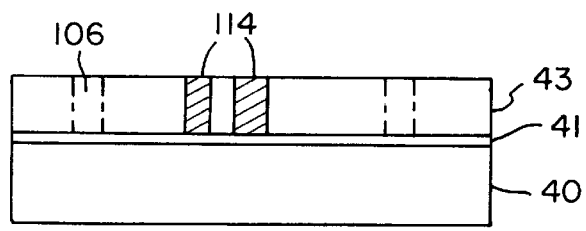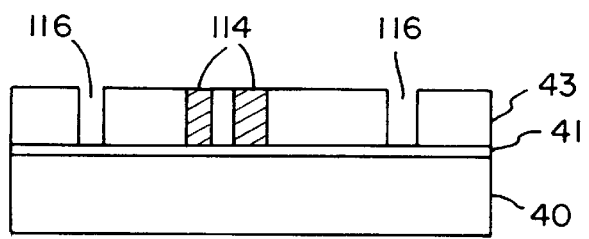

RADIATION MASK ADAPTED TO BE ALIGNED WITH A PHOTORESIST LAYER AND METHOD OF MAKING THE SAME

This application is a divisional of application Ser. No. 08/753,645, filed Nov. 27, 1996, now abandoned.

This invention was made with United States government support awarded by the following agencies: DOD ARPA Grant No. N00014-93-1-0911 and NSF Grant No. ECS9116566. The United States has certain rights in this invention.

FIELD OF THE INVENTION

This invention pertains generally to the field of semiconductor and micromechanical devices and processing techniques therefor, and particularly to the formation of multi-level microminiature structures such as those formed of metal.

BACKGROUND OF THE INVENTION

Deep X-ray lithography involves a substrate which is covered by thick photoresist, typically several hundred microns in thickness, which is exposed through a mask by X-rays. X-ray photons are much more energetic than optical photons, which makes complete exposure of thick photoresist films feasible and practical. Furthermore, since X-ray photons are short wavelength particles, diffraction effects which typically limit device dimensions to two or three wavelengths of the exposing radiation are absent for mask dimensions above 0.1 micron. If one adds to this the fact that X-ray photons are absorbed by atomic processes, standing wave problems, which typically limit exposure of thick photoresist by optical means, become a non-issue for X-ray exposures. The use of a synchrotron for the X-ray source yields high flux densities, several watts per square centimeter, combined with excellent collimation to produce thick photoresist exposures with minimal horizontal run-out. Locally exposed patterns should therefore produce vertical photoresist walls if a developing system with very high selectivity between exposed and unexposed photoresist is available. This requirement is satisfied by polymethylmethacrylate (PMMA) as the X-ray photoresist, and an aqueous developing system. See, e.g., H. Guckel, et al., "Deep X-ray and UV Lithographies for Micromechanics", Technical Digest, Solid State Sensor and Actuator Workshop, Hilton Head, S.C., Jun. 4–7, 1990, pp. 118–122.

As the thickness of the photoresist is increased, e.g., beyond 500 μm, difficulties have been encountered when relatively soft (lower photon energy) X-ray sources are used for photoresist exposure. The wavelengths of soft X-rays are long enough that diffraction effects can lead to penumbral blurring of the X-ray mask shadow image. Difficulties can also arise from interface phenomena caused by the non-negligible reflectivity of common photoresist materials with respect to soft X-rays. It has also been found that for resist sheets thicker than about 500 μm, soft X-rays cannot penetrate sufficiently to the bottom of the resist layer to guarantee development of the bottom regions of the resist without such a large exposure that the dose at the upper regions of the resist would become so high as to cause destructive overexposure. Such overexposure can cause distortion or fracture of the resist layer, or even destruction of the fragile soft X-ray mask which is typically positioned within a few microns of the resist layer. However, these problems can be avoided by exposing thick photoresist layers using hard (high energy) X-rays. Hard X-rays may be obtained by spectral shaping the X-ray beam from a source, such as a synchrotron, having a significant spectral content of high energy X-rays to substantially eliminate lower energy photons which have a short absorption length in the photoresist, and which would tend to be substantially absorbed near the top surface of the photoresist. Spectral shaping for hard X-rays may be accomplished by spectral filtering using, e.g., aluminum and/or silicon filters. The penetrating ability of hard X-rays allows photoresist layers up to several centimeters thick to be exposed, allows multiple stacked photoresist layers and substrates to be exposed simultaneously, and allows the X-ray mask to be formed on robust substrates, such as relatively thick and wide single crystal silicon wafers, on which an X-ray absorber such as gold is deposited in a pattern.

Deep X-ray lithography may be combined with electroplating to form high aspect ratio structures. This requires that the substrate be furnished with a suitable plating base prior to photoresist application. Typically, this involves a sputtered film of adhesive metal such as chromium or titanium, which is followed by a thin film of a metal which is to be plated. Exposure through a suitable mask and development are followed by electroplating. This results, after clean-up, in fully attached metal structures with very high aspect ratios. Such structures were reported by W. Ehrfeld and co-workers at the Institute for Nuclear Physics at the University of Karlsruhe in West Germany. Ehrfeld termed the process "LIGA" based on the first letters of the German words for lithography and electroplating. A general review of the LIGA process is given in the article by W. Ehrfeld, et al., "LIGA Process: Sensor Construction Techniques Via X-ray Lithography", Technical Digest, IEEE Solid State Sensor and Actuator Workshop, 1988, pp. 1–4.

The addition of a sacrificial layer to the LIGA process facilitates the fabrication of fully attached, partially attached, or completely free metal structures. Because device thicknesses are typically larger than 10 microns and smaller than 300 microns, free standing structures will not distort geometrically if reasonable strain control for the plated film is achieved. This fact makes assembly in micromechanics possible, and thereby leads to nearly arbitrary three-dimensional structures. See H. Guckel, et al., "Fabrication of Assembled Micromechanical Components Via Deep X-ray Lithography", Proceedings of IEEE Micro Electro Mechanical Systems, Jan. 30–Feb. 2, 1991, pp. 74–79.

It is possible to extend the LIGA process, with or without a sacrificial layer, for the formation of multi-layer micromechanical structures. This is achieved by performing several X-ray exposures of multiple photoresist layers, with electroplating of additional layers of metal after each exposure. In such a procedure, metal microstructures may be electroplated both onto the substrate plating base and onto the top surface of previously deposited microstructure layers. Replanarization of previously deposited microstructure layers, to achieve a substantially flat uniform surface, is typically required before electroplating subsequent metal microstructure layers thereon. Various machining, lapping, and polishing procedures may be used for replanarization.

A key to successful fabrication of multi-layer micromechanical device structures is the accurate alignment of subsequently deposited microstructure layers with previously deposited ones. For example, if a gear-shaft-gear combination is to be fabricated, with each component of the combination formed on a different microstructure layer, only a small eccentricity between the axes of the gears and shaft, and thus only a small alignment error between the microstructure layers, can be tolerated. Hence, a procedure to achieve high alignment accuracy between layers must be available in order to extend LIGA for the fabrication of multi-layer micromechanical devices.

Alignment procedures similarly play an important role in the related field of microelectronics fabrication. Microelectronics manufacturing uses alignment procedures for the fabrication of multi-level integrated circuits. Alignment procedures used in Very Large Scale Integration (VLSI) processing for microelectronics, for example, are usually of an optical nature. In the VLSI process, each level is formed to contain reference marks at a certain location. These marks are used for optically aligning a subsequent mask to a previous level. A microscope is focused on the alignment marks on both the previous work level and the subsequent level mask. The mask is then positioned such that the marks on the work level and the mask are optically aligned with each other, thus aligning the subsequent mask pattern with the previous level microelectronic pattern. During optical exposure through the subsequent mask, new alignment marks are transferred to the current work level. Using this method, the several layers which make up an integrated circuit are aligned with each other.

Since visible light is used for the optical alignment procedure, the procedure is limited to alignment gaps between the substrate and the mask which lie in the range of the depth of focus of the alignment microscope. In VLSI processing, the alignment gap between the device substrate and the mask is on the order of a few micrometers. However, in LIGA processes for the fabrication of relatively thick metal microstructures, the mask and the device substrate may typically be more than 100 micrometers apart. For the magnification required to optically align the LIGA substrate to a mask with submicron tolerance, the depth of focus is much less than 100 micrometers. Moreover, X-ray masks used in LIGA processing are typically formed from a silicon wafer (for hard X-rays) or a silicon wafer which includes a silicon nitride membrane (for soft X-rays) upon which a thin metal plating base layer is deposited for subsequent formation of the mask pattern by plating of an X-ray blocking material, such as gold, onto the plating base layer. The X-ray masks used in LIGA processing in most cases are, therefore, not optically transparent. For these reasons, the optical alignment procedure used in VLSI processing cannot easily be applied to the fabrication of multilayer micromechanical devices by the LIGA process.

An alignment procedure that may be used for fabrication of multi-layer microstructures by the LIGA process is suggested in U.S. Pat. No. 5,378,583, to Guckel. et al., entitled "Formation of Microstructures Using a Preformed Photoresist Sheet". This patent describes the use of thick preformed sheets of photoresist for the fabrication of photoresist and metal microstructures. Multiple photoresist sheets may be exposed to X-rays in various patterns, and then adhered together into a laminate. The laminate may then be adhered to a substrate and used for the fabrication of metal microstructures. Alignment of the various photoresist layers, such that microstructure regions formed therein by exposure to X-rays are aligned with each other, may be achieved by creating mechanical alignment structures during exposure of each photoresist layer, and then using these alignment structures to obtain mechanical registration between a previous layer and a subsequent layer. Exemplary alignment structures may consist of relatively large holes formed in each photoresist layer on opposite sides of the patterned portion thereof. The holes may be formed as part of the X-ray exposure and developing process for patterning the photoresist layer, so that the microstructure pattern and the alignment holes are formed simultaneously for each layer, and so that the relative position of the alignment holes with respect to the microstructure pattern is precisely controlled. The alignment holes are designed to accept pegs, which may be formed of a photoresist material or metal. Alignment between photoresist layers is achieved by assembling mounting holes in a subsequent layer onto the pegs placed in mounting holes from the previous layer, and gluing the subsequent photoresist layer to the underlying layer. Self-alignment is obtained because the alignment holes are exposed at the same time as the desired pattern in each layer, and therefore the alignment tolerance is governed by assembly tolerances. After the desired number of photoresist layers have been built up into a laminate, metal may be electroplated into the microstructure pattern regions in the photoresist laminate, if desired, to effectively form a multi-layer metal microstructure.

SUMMARY OF THE INVENTION

The present invention provides an alignment by assembly procedure whereby an X-ray mask may be aligned with a previously patterned photoresist layer such that a microstructure pattern defined by the subsequent mask is precisely aligned with the previously produced microstructure pattern. Precise alignment is achieved by direct assembly of an X-ray mask upon a previously processed first photoresist layer. A first X-ray mask is used to form a microstructure pattern and first alignment holes in the first photoresist layer. Corresponding mask alignment holes are formed in a mask photoresist layer attached to the subsequent X-ray mask. Alignment of the microstructure pattern defined by the subsequent X-ray mask and the microstructure pattern previously formed in the first photoresist layer is achieved by assembling the subsequent X-ray mask onto the first photoresist layer using alignment posts mounted in the first alignment holes in the first photoresist layer and in the mask alignment holes in the mask photoresist layer on the subsequent X-ray mask. The alignment procedure of the present invention is thus entirely mechanical, and does not require the use of complicated alignment equipment, such as an optical alignment microscope.

The alignment procedure of the present invention is particularly applicable to the fabrication of multi-layer microstructures using multiple photoresist layers. The alignment procedure of the present invention may be used for the fabrication of multi-layer photoresist structures, multi-layer photoresist laminates including microstructures formed therein, and multi-layer metal microstructures formed by the LIGA process using multiple photoresist layers. The alignment procedure of the present invention may also be used in the fabrication of single layer microstructures, to align the microstructure patterns defined by multiple X-ray masks onto a single photoresist layer. The present invention may be used with X-ray masks employed for photoresist layer exposure using either soft or hard X-rays.

The alignment procedure of the present invention begins with the application of a first thick photoresist layer, up to several hundred microns in thickness, unto a substrate. For the fabrication of a multi-layer metal microstructure using the LIGA fabrication process, the substrate preferably has a metal plating base layer formed thereon beneath the first photoresist layer. The first layer of photoresist may preferably be formed as a preformed photoresist sheet which is bonded to the plating base layer. The first photoresist layer is exposed to X-rays through a first X-ray mask to define a pattern in the first photoresist layer. The pattern defines the first layer microstructure pattern and first alignment hole geometries to be formed in the first photoresist layer. For soft X-ray exposure, the mask may be formed on a silicon wafer substrate which has thin silicon nitride device and alignment structure membrane areas formed thereon. Multiple alignment structure membrane areas are preferably defined, one for each alignment hole to be formed in the first photoresist layer on the device substrate. The alignment structure membrane areas are preferably positioned on opposite sides of the device membrane area to minimize the effect of alignment structure errors on the microstructure devices to be formed. A mask pattern of an X-ray absorbing material, such as gold, is then formed over the device and alignment structure membrane areas. The mask pattern defines, in the device membrane area, the first layer metal microstructures to be produced, and, in the alignment structure membrane areas, alignment hole geometries to be formed in the first photoresist layer. The alignment hole geometry is preferably a square or rectangular shape with rounded corners, although other shapes may also be used. For hard X-ray exposure, the X-ray mask may be formed on a robust substrate, such as relatively thick and wide single crystal silicon wafers. Since the hard X-rays are able to penetrate the X-ray mask substrate, the hard X-ray mask need not have the membrane areas formed thereon, rather, the X-ray mask pattern is formed by deposition of X-ray absorbing materials defining the device pattern and alignment hole geometries on device and alignment structure areas of the hard X-ray mask, respectively.

The first layer microstructure pattern and alignment hole geometries are transferred to the first photoresist layer on the device substrate by exposing the first photoresist layer to X-rays through the first X-ray mask. Exposed portions of the first photoresist layer thus correspond to the microstructure device pattern and the alignment hole geometries defined by the first X-ray mask pattern. These exposed portions of the first photoresist layer are removed by a developing process to form first alignment holes in the first photoresist layer, and, for metal microstructure fabrication, to expose the plating base layer in the pattern of the first microstructure layer to be formed. A first layer of a multi-layer metal microstructure may then be deposited by electroplating onto the plating base, into the areas of the first photoresist layer corresponding to the microstructure device pattern that have been removed by the developing step. The first photoresist layer and the first layer microstructures formed therein may then be planarized and polished in preparation for the application of a second photoresist layer onto the first photoresist layer, and deposition of subsequent metal layers onto the previously deposited layer.

A second photoresist layer is then applied over the first photoresist layer. The second photoresist layer is preferably a preformed photoresist sheet which is bonded to the first photoresist layer over a portion of the first photoresist layer which, for metal microstructure device fabrication, includes the deposited first layer metal microstructures. The second photoresist layer does not cover the first alignment holes formed in the first photoresist layer.

A second X-ray mask, for either soft or hard X-ray exposures, is formed in the manner previously described with respect to the first X-ray mask. The second X-ray mask includes a device area patterned with X-ray absorbing material in the desired pattern of, for example, a second layer of metal microstructure devices to be formed. Alignment structure areas of the second X-ray mask have X-ray absorbing materials formed thereon in a pattern corresponding to the geometry of the first alignment holes formed in the first photoresist layer on the device substrate. The alignment structure and device patterns of the first mask and the second mask are laid out such that when the alignment structures defined by each mask are aligned, the device patterns are also aligned. Thus, the microstructure device patterns formed on the X-ray masks, and subsequently transferred to photoresist layers on the device substrate, will be in proper alignment when the alignment structure patterns on the X-ray masks and in the photoresist layers are aligned.

A mask photoresist layer is applied over each alignment structure area of the second X-ray mask. The photoresist layer may be applied over the alignment structure area on the front side of the X-ray mask, directly over the alignment hole geometry mask pattern, or over the back of the X-ray mask in an area corresponding to the alignment structure area on the front of the mask. Preferably, the mask photoresist layer is applied to the front side of the X-ray mask over the alignment structure area, but elevated therefrom. This is accomplished by first applying photoresist sheets to the front side of the X-ray mask outside of the alignment structure area, and then attaching the mask photoresist layer to these photoresist sheets over the alignment structure area. The mask photoresist layer thereby extends between the photoresist sheets over the alignment structure area, e.g., over the alignment structure membrane for a soft X-ray mask. The mask photoresist layer is then exposed to X-rays through the second X-ray mask to transfer the alignment hole geometry defined by the second X-ray mask pattern onto the mask photoresist layer. The exposed mask photoresist layer is then developed to form mask alignment holes therein, corresponding in shape to the alignment hole geometry defined by the second X-ray mask pattern and the first alignment holes formed in the first photoresist layer on the device substrate.

The second X-ray mask is assembled onto the first photoresist layer using alignment posts. The alignment posts have a geometry corresponding to that of the alignment holes, and are sized to fit snugly therein. The alignment posts may be formed of metal by a LIGA fabrication process employing a sacrificial layer to form freed metal parts. Alternatively, and preferably, the alignment posts may be formed of a photoresist material. This may be accomplished by attaching a thick preformed photoresist sheet to a sacrificial layer formed on a substrate. The photoresist layer is then exposed to X-rays through a mask which includes X-ray absorbers formed thereon in a pattern defining the shape of the alignment posts. The photoresist layer is then developed to remove the exposed portions thereof, leaving behind freestanding photoresist structures in the shape of the alignment posts. The sacrificial layer is then removed from beneath the freestanding photoresist structures to free the alignment posts from the substrate.

The alignment posts are used to assemble the second X-ray mask onto the first photoresist layer. Alignment posts are placed in the first alignment holes formed in the first photoresist layer on the device substrate such that the alignment posts extend above the surface of the first photoresist layer. The second X-ray mask is then positioned over the first photoresist layer until the alignment posts penetrate into the mask alignment holes on the second X-ray mask. The alignment posts thus automatically ensure proper alignment of the first alignment holes formed in the first photoresist layer of the device substrate with the mask alignment holes formed in the photoresist layer on the second X-ray mask. This also automatically aligns the second X-ray mask microstructure device pattern with the microstructure device pattern previously formed in the first photoresist layer.

The second photoresist layer on the device substrate may then be exposed to X-rays through the second X-ray mask to transfer the second layer microstructure device pattern to the second photoresist layer. The second photoresist layer is then developed to remove the exposed portion thereof and to form the second layer microstructure device pattern therein. A second layer of metal microstructure devices may be deposited into the pattern formed in the second photoresist layer by electroplating onto the tops of the first layer microstructure devices formed in the first photoresist layer. Second layer microstructure devices may also be electroplated directly onto the plating base layer if the exposure of the second photoresist layer through the second X-ray mask is allowed to proceed for a sufficient duration to also expose the first photoresist layer through to the plating base layer.

The alignment procedure of the present invention may be extended for subsequent photoresist layers applied on top of the second photoresist layer. Metal microstructures of more than two layers may thus be formed by aligning subsequent X-ray masks with the first photoresist layer on the device substrate. As with the second X-ray mask, each subsequent X-ray mask includes mask alignment holes formed in a mask photoresist layer attached thereto. These mask alignment holes are joined to the first alignment holes in the first photoresist layer using longer alignment posts, or multiple alignment posts stacked in series in combination with spacer sheets made out of photoresist and having central apertures shaped to receive the alignment posts. Spacer sheets may also be used generally to ensure a sufficiently large exposure gap between the second X-ray mask and the second photoresist layer.

The alignment procedure of the present invention may be used for the fabrication of multi-layer metal microstructures attached to a substrate. Free multi-layer metal microstructure parts may also be fabricated using the present invention if a sacrificial layer is employed between the metal microstructures and the substrate. Since the alignment procedure of the present invention does not interfere with device substrate preparation, the present invention is fully compatible with IC fabrication techniques, and may be used for the fabrication of multi-layer metal microstructures on substrates containing preformed integrated circuits. The alignment procedure of the present invention also does not significantly reduce the substrate area available for microstructure device fabrication.

The alignment procedure of the present invention is cost-effective because conventional LIGA processing tools, which are already available, are employed in fabricating the alignment structures. The alignment procedure of the present invention is an inexpensive and time efficient process. Two microstructure levels may be aligned in five to ten minutes at the X-ray exposure site, without requiring any expensive optical or precision alignment instruments.

The alignment procedure of the present invention can accommodate different photoresist sheet heights and gaps between the X-ray mask and the device substrate. The ability to accommodate more than two photoresist layers on the substrate also exists.

The alignment procedure of the present invention may be standardized for repetitive use in multi-level LIGA processes. Standardized X-ray mask shapes, alignment structure geometries, and processing sequences, can be used.

The alignment procedure can be used for a variety of different X-ray beam, X-ray mask, and wafer sizes. A simple re-design of device and alignment membranes can accommodate virtually any wafer size.

The alignment procedure of the present invention has been employed to achieve alignment accuracies of better than 4 micrometers for LIGA structures greater than 100 micrometers in height. Such a range of accuracy is close to optimum for precision fabrication using LIGA-like processing.

The alignment procedure of the present invention may be used for the fabrication of microstructure devices using hard X-ray exposures. This allows very thick (up to several cm) photoresist layers to be exposed. Moreover, since hard X-rays can penetrate the substrate upon which the photoresist layers are attached, a hard X-ray mask aligned with the substrate in accordance with the present invention on one side of the substrate may be used to expose multiple photoresist layers on the opposite side of the substrate.

It is apparent that the alignment procedure of the present invention may be employed in the fabrication of non-metal microstructures, such as photoresist microstructures and photoresist laminations having microstructures formed therein. The alignment procedure may also be employed with radiation masks designed for use with other than X-ray radiation, such as UV radiation masks used in integrated circuit fabrication.

Further objects, features, and advantages of the invention will be apparent from the following detailed description when taken in conjunction with the accompanying drawings.

BRIEF DESCRIPTION OF THE DRAWINGS

In the drawings:

FIG. 17 is an illustrative side view of the exposed substrate of FIG. 16 showing masking tape placed over exposed portions of the first photoresist layer corresponding to first alignment holes.

FIG. 18 is an illustrative plan view of the substrate of FIG. 17.

FIG. 19 is an illustrative side view of the substrate of FIG. 17 after the first photoresist layer has been developed to expose a portion of the plating base layer in a device area of the substrate.

FIG. 20 is an illustrative side view of the substrate of FIG. 19 with metal microstructures electroplated onto the plating base layer into areas of the first photoresist layer which were removed during development.

FIG. 21 is an illustrative side view of the substrate of FIG. 20 after the photoresist layer is developed for a second time to form first alignment holes therein.

DETAILED DESCRIPTION OF THE INVENTION

The alignment procedure of the present invention will be described in detail with respect to the exemplary application of the fabrication of a two-level metal microstructure using the LIGA fabrication process. The details of LIGA processing itself are know to those having skill in the art. A detailed description of an exemplary process for carrying out the production of micromechanical structures using the LIGA process is described, for example, in U.S. Pat. No. 5,190, 637, to Henry Guckel, entitled "Formation of Microstructures by Multiple Level Deep X-ray Lithography with Sacrificial Metal Layers," the disclosure of which is incorporated herein by reference. It should be noted that the alignment procedure of the present invention may also be applied to other micromechanical and microelectronic device fabrication processes. In particular, the alignment procedure of the present invention may be employed for the fabrication of multi-layer photoresist microstructures, multi-layer photoresist laminates including microstructures formed therein, and single layer photoresist and metal microstructures fabricated using multiple exposures through different X-ray masks. Variations on the exemplary procedure described will be discussed throughout this detailed description.

Figure 1:
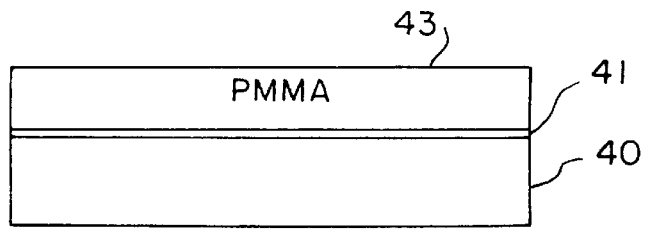
FIG. 1 is a simplified illustrative side view of a substrate with a plating base and a first photoresist layer formed thereon.

With reference to FIG. 1, a device substrate 40 is provided, upon which a multi-layer metal microstructure will be formed. The substrate 40 may comprise a variety of materials, including semiconductors, insulators, and so forth. The substrate 40 may also incorporate preformed integrated circuit structures. Since the alignment procedure of the present invention does not interfere with preparation of the substrate 40, the procedure allows the formation of aligned multi-layer microstructures in combination with electronics in the substrate 40. Typically, a metal plating base layer 41 will be deposited onto the top surface of the substrate 40, such as by sputtering. The substrate 40 could be composed of a conductive metal, in which case no plating base may be necessary. For the formation of parts to be freed from the substrate 40, a sacrificial release layer (not shown) may be used beneath the plating base layer 41. A first photoresist layer 43, for example, polymethylmethacrylate (PMMA) is then applied to the substrate. Depending on the type of radiation used to expose the photoresist 43, the depth of exposure desired, and the properties of available photoresist, it is apparent that positive or negative photoresist may be used. Throughout the remainder of this description, a positive photoresist which becomes susceptible to removal by a developer upon exposure to X-rays will be assumed. It is understood, however, that other types of photoresist, including negative photoresist materials, as well as photoresist sensitive to other types of radiation, including UV radiation, may be employed to form microstructures using the alignment procedure of the present invention. The first photoresist layer 43 may be cast-on to the desired thickness, or may be applied as a pre-formed photoresist sheet. For thicker photoresist layers, especially those having thicknesses greater than 200 microns, use of a preformed photoresist sheet is preferred. The curing process applied to a cast-on photoresist layer of such a thickness can cause internal strain in the photoresist layer that can distort the cast-on photoresist layer, and cause loss of adhesion between the photoresist layer 43 and the substrate 40. The preformed photoresist sheet 43 is preferably adhered to the surface of the substrate 40 using a suitable adhesive, such as a relatively thin spun-on film of PMMA which is applied to the substrate 40 in a conventional manner, and cured to form a strong bond to the substrate 40. The use of preformed photoresist sheets in the formation of metal microstructures is described in more detail in U.S. Pat. No. 5,378,583, to Henry Guckel, et al., entitled "Formation of Microstructures Using A Preformed Photoresist Sheet", the disclosure of which is incorporated herein by reference.

The next step in the LIGA fabrication process is to expose the first photoresist layer 43 to X-rays through an X-ray mask, to transfer a microstructure device pattern from the mask to the first photoresist layer 43. In accordance with the present invention, a first alignment hole pattern is simultaneously transferred from the X-ray mask to the first photoresist layer 43. An exemplary process for fabricating an X-ray mask to provide both microstructure device and alignment hole patterns is described with reference to FIGS. 2–15. This example assumes exposure of the photoresist layer 43 using soft X-rays. A mask for use with soft X-rays has thin membrane areas formed on a thick substrate. The substrate provides the structural support for the mask, with the membrane areas defining those areas of the mask through which soft X-rays may pass. For thicker photoresist layers, e.g., up to several centimeters in thickness, the use of high energy hard X-rays is preferred. Since hard X-rays can penetrate mask substrate materials, the use of thin and fragile membrane areas is not required. Instead, a hard X-ray mask may be formed by depositing the X-ray absorbing mask pattern onto a relatively thick and wide substrate, such as a single crystal silicon wafer. The ability to use relatively thick X-ray mask substrates (e.g., 300 to 400 μm thick silicon) greatly reduces the cost of mask production as compared to the very thin and fragile mask substrates required for soft X-ray masks, and allows much wider masks to be made (e.g., 4 to 6 inches in diameter) because of the greater structural strength of the thicker substrate, thereby allowing exposure of a wide target area to increase batch production. The thicker mask is also more durable and can be used for many more exposures than a thin mask. The short wavelength of hard X-rays and collimation of the source also make it possible to use macroscopically thick self supporting materials as a mask. These include conventionally machined self-supporting pieces of various high atomic weight materials including copper, tungsten, molybdenum, tentalum and lead as masks where the precision of the mask is not an issue. However, for a practical, high tolerance, high precision mask system, particularly where feature sizes may be significantly less than one mm, a lithographically produced mask, such as the one to be described, is highly preferred. What must be understood, is that the alignment procedure of the present invention is not limited to the particular type of mask to be described in detail herein. In particular, the present invention is not limited to masks that have mask membranes as such. Thus, as used herein, the terms device and alignment structure "membrane" areas, may be understood to also describe areas corresponding to the device and alignment structure mask patterns on masks that do not have "membranes".

Figure 2:
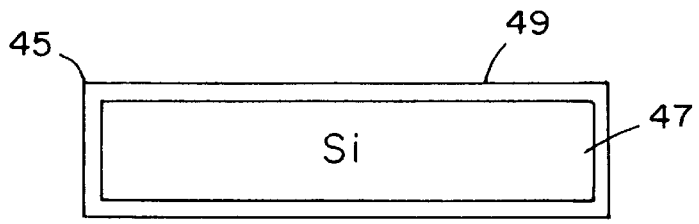
FIG. 2 is a simplified illustrative side view of an X-ray mask wafer having a silicon nitride layer formed thereon.

As illustrated in FIG. 2, formation of an X-ray mask 45 for processing of the first photoresist layer 43 using soft X-rays begins with a clean silicon wafer 47 to which an approximately 1 micrometer thick optically transparent polysilicon (e.g., silicon nitride) layer 49 is applied. The silicon nitride layer 49 covers the silicon wafer 47, and may be applied to the silicon wafer 47 using a conventional vapor deposition technique.

Figure 3:
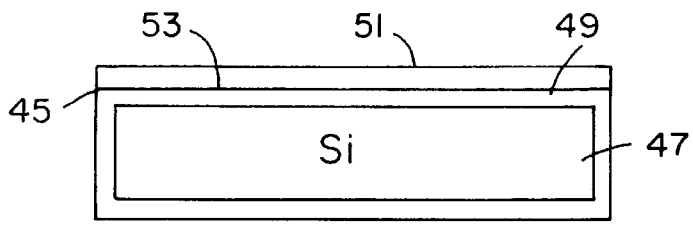
FIG. 3 is a view of the X-ray mask wafer of FIG. 2 with a layer of photoresist formed on the back side thereof.

A UV light sensitive photoresist layer 51 is then spun-on to the back side 53 of the X-ray mask 45 over the silicon nitride layer 49, as illustrated in FIG. 3. The spun-on photoresist layer 51 is cured by baking, e.g., at 90° C.

Figure 4:
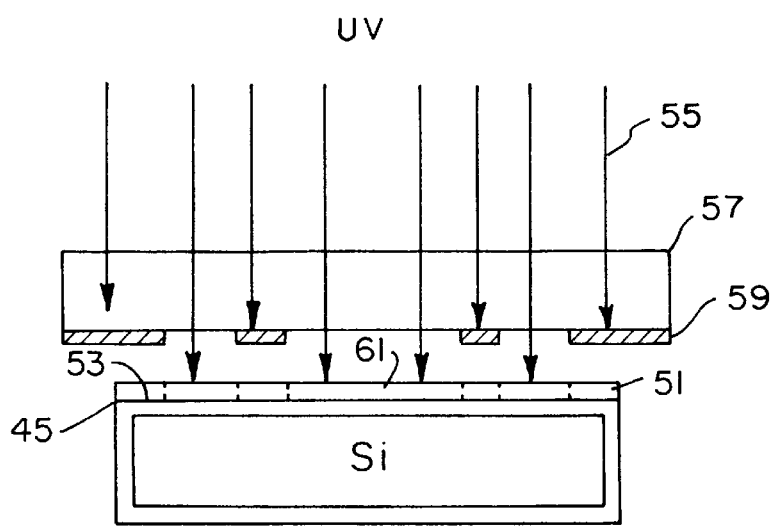
FIG. 4 is an illustrative view showing the X-ray mask wafer of FIG. 3 exposed through a mask to UV light.

As illustrated in FIG. 4, the photoresist layer 51 on the back side 53 of the X-ray mask 45 is then exposed to UV light 55 through a UV mask 57. The UV mask 57 has a non-transparent layer 59 formed thereon in a pattern which prevents the passage of the UV light 55 therethrough. The portions 61 of the photoresist layer 51 that are exposed to the UV light 55 through the mask 57 are made susceptible to removal by a developer.

Figure 5:
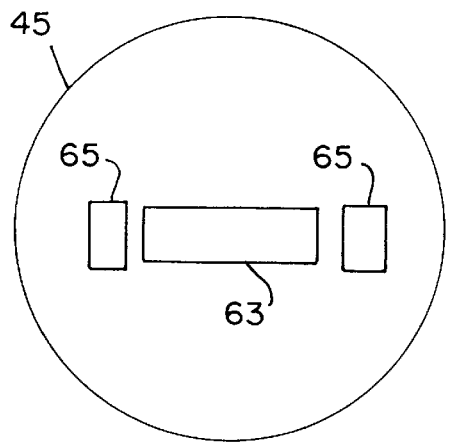
FIG. 5 is an illustrative plan view of the X-ray mask wafer of FIG. 4 showing a layout of device and alignment structure membrane areas thereon.
Figure 6:
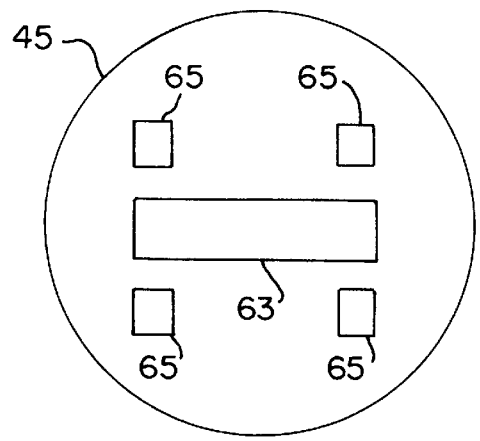
FIG. 6 is an illustrative plan view of an X-ray mask wafer showing an alternative layout of device and alignment structure membrane areas thereon.

The non-transparent layer 59 is formed on the mask 57 in a pattern that defines device and alignment structure membrane areas on the mask 45. Two alternative layouts for the device 63 and alignment structure 65 membrane areas on the X-ray mask 45 are illustrated in FIGS. 5 and 6. Each of the alternative membrane layouts illustrated in FIGS. 5 and 6 include a single device membrane area 63. As will be described in more detail below, a mask pattern that defines the microstructure pattern to be formed on the device substrate 40 will be formed in the device membrane area 63 of the X-ray mask 45. The exemplary membrane layout of FIG. 5 includes two alignment structure membrane areas 65 located on opposite sides of the device membrane area 63. The exemplary membrane layout illustrated in FIG. 6 includes four alignment structure membrane areas 65 also arranged on opposite sides of and around the device membrane area 63. As will be discussed in more detail below, a mask pattern defining alignment hole geometries used in the alignment procedure of the present invention will be formed in each alignment structure membrane area 65 of the X-ray mask wafer 45.

It should be noted that layouts other than those illustrated in FIGS. 5 and 6 may also be used in accordance with the present invention. For example, 3, 5, or more alignment structure areas 65 may be formed. The device 63 and alignment structure 65 areas may be of various shapes, and arranged in various patterns on the X-ray mask wafer 45. However, in laying out the alignment structure 65 and device areas 63 on the X-ray mask 45, it is preferable to place the alignment structure areas 65 as far apart as possible on opposite sides of the device area 63. This layout will help to minimize alignment inaccuracies. Maximum inaccuracies will typically occur in areas corresponding to the alignment structure areas 65 where, as will be discussed, alignment posts and alignment holes are joined together. Thus, with, for example, the alignment area layout of FIG. 5, the alignment errors at the center of the X-ray mask 45, i.e., the area corresponding to the microstructure device pattern, will be at most as large as the errors in the alignment structure areas 65. For example, if the left side of the X-ray mask 45 is shifted downward and the right side is shifted upward when aligned with the first photoresist layer 43, the same twist angle will appear as a misalignment at the center of the device membrane area. However, the offset in the center will be smaller than each of the offsets in the alignment structure areas 65. Thus, the alignment structure areas 65 are preferably chosen to be formed on opposite sides of the device area 63.

Even better alignment accuracy may be achieved with the alignment area layout illustrated in FIG. 6. Adding additional alignment structure areas 65 on opposite sides of the device area 63 ensures that both horizontal and vertical offsets are partially compensated for by reverse shifts at opposite alignment structure areas. For example, in the alignment structure area layout of FIG. 5, if the assembly of the alignment structures is not perfect, e.g., there is a gap between the alignment posts and the alignment holes forming the alignment structures in the alignment structure areas 65, the X-ray mask 45 can slide by a small degree in the vertical direction with respect to the photoresist layer to which it is to be aligned. An error in the horizontal direction is less likely, since the alignment structures formed in the alignment structure area 65 on the opposite side of the device area 63 will pull or push in the opposite direction (unless the same gap is found in both alignment structure areas 65). Thus, the alignment structure area layout of FIG. 5 tends to center the X-ray mask 45 in a horizontal direction with respect to the photoresist layer to which it is to be aligned. The purpose of the additional alignment areas 65 in the layout of FIG. 6 is to obtain the same effect in the vertical direction. With the layout of FIG. 6, a smaller and more uniform offset in both the vertical and horizontal directions can be expected.

Figure 7:
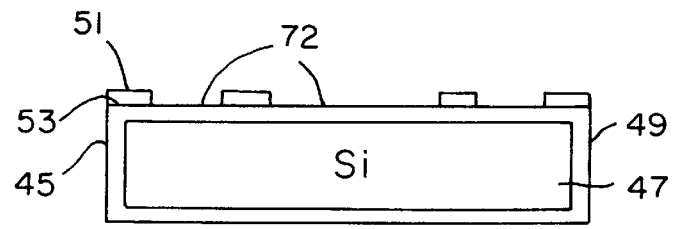
FIG. 7 is an illustrative side view showing the X-ray mask wafer of FIG. 4 after development of the exposed photoresist layer.

After the photoresist layer 51 has been exposed to UV light through the UV mask 57, the exposed portions 61 of the photoresist layer 51 are removed by developing the photoresist layer 51. As illustrated in FIG. 7, this exposes areas 72 of the silicon nitride layer 49. The exposed areas 72 of the silicon nitride layer 49 correspond to the device 63 and alignment structure areas 65 as defined by the pattern of the non-transparent layer 59 on the UV mask 57.

Figure 8:
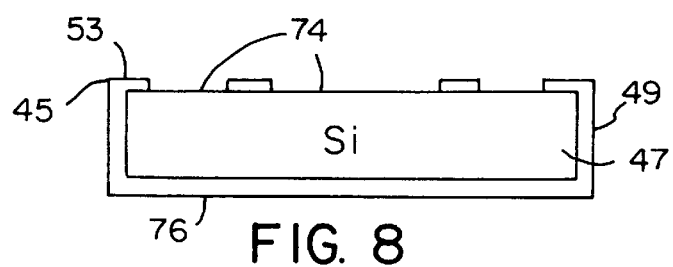
FIG. 8 is an illustrative view showing the X-ray mask wafer of FIG. 7 after etching of a portion of the silicon nitride layer from the back side of the mask wafer to form silicon nitride windows in the areas from which the exposed photoresist was removed during development, and after removal of the remaining photoresist layer.
Figure 9:
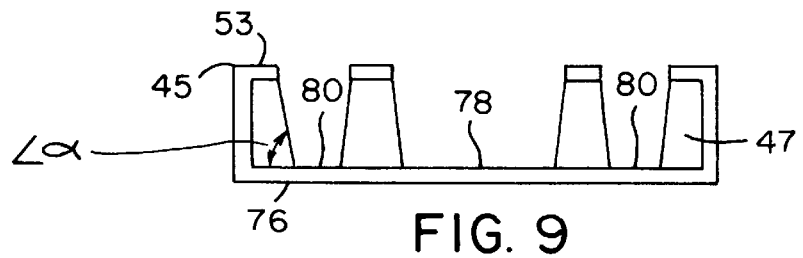
FIG. 9 is an illustrative side view of the X-ray mask wafer of FIG. 8 after etching of the X-ray mask wafer from the back side in the silicon nitride windows to form device and alignment structure membranes thereon.

A reactive ion etch of the exposed areas 72 of the silicon nitride layer 49 on the back side 53 of the X-ray mask 45 is then performed. During this operation, the remaining photoresist layer 51 acts as a mask of the silicon nitride layer 49. Thus, the reactive ion etch removes only the exposed portions 72 of the silicon nitride layer 49. After the reactive ion etch, the remainder of the photoresist layer 51 may be removed. The resulting structure is illustrated in FIG. 8. As shown, the reactive ion etch leaves windows 74 in the silicon nitride layer 49 on the back side 53 of the X-ray mask 45. The windows 74 in the silicon nitride layer 49 expose portions of the silicon wafer 47. The exposed portions of the silicon wafer 47 correspond to the device 63 and alignment structure membrane 65 areas described previously.

Portions of the silicon wafer 47 exposed by the windows 74 in the silicon nitride layer 49 are then etched along the silicon crystal boundaries from the back side 53 of the X-ray mask 45 to the front side 76 of the X-ray mask 45. This etching process does not attack the silicon nitride layer 49. The etching process results, when complete, in the structure illustrated in FIG. 9. The removal of portions of the silicon wafer 47 by the etching process forms silicon nitride membranes 78 and 80 on the front side 76 of the X-ray mask 45. A device membrane 78, and alignment structure membranes 80, are thereby formed in the device 63 and alignment structure 65 membrane areas defined earlier. The silicon nitride device and alignment structure membranes 78 and 80 are thin, fragile and substantially transparent.

In sizing the device 63 and alignment structure 65 membrane area layouts to be formed on the back side 53 of the X-ray mask 45 which are necessary to achieve correctly sized device 78 and alignment structure 80 membranes on the front side 76 of the X-ray mask 45, it is essential to consider the important silicon-crystal definition. In the procedure for forming the device 78 and alignment structure 80 membranes described above, etching of the silicon wafer 47 proceeds along silicon-crystal boundaries. Commercially available silicon wafers have pre-defined direction planes. The windows 74 in the silicon nitride layer 49 on the top 53 of the X-ray mask 45 are laid out in directions parallel and perpendicular to the planes. The planes in silicon function as an etch stop. Thus, the etch angle a into single crystal silicon can be calculated. From the etch angle, the dimensions of the windows 74 in the silicon nitride layer 49 on the back side 53 of the X-ray mask 45 necessary to obtain a certain size for the silicon nitride membranes 78 and 80 on the front side 76 of the X-ray mask 45 can be calculated. For example, for commercially available silicon with an etch angle of $\alpha=54.7356°$, to obtain a membrane 78 or 80 of specific size, the initial rectangular etch area on the back side 53 of the X-ray mask 45 has to be $\Delta x=d/\tan\alpha$ larger in all directions, where d is the thickness of the silicon wafer 47. For a wafer of approximately 400 micrometers in thickness, $\Delta x$ is about 280 micrometers.

Figure 10:
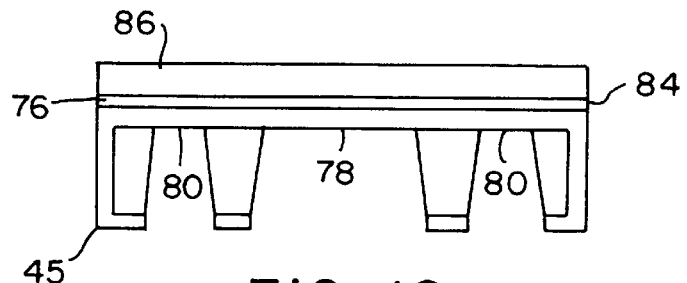
FIG. 10 is an illustrative side view of the X-ray mask wafer of FIG. 9 with the addition of plating base and photoresist layers formed on the front side thereof.

Formation of the X-ray mask 45 proceeds, as illustrated in FIG. 10, with cleaning of the silicon nitride surface on the front side 76 of the X-ray mask 45. A thin metal plating base layer 84 is then applied over the device and alignment structure membranes 78 and 80. The conductive plating base layer 84 may be applied, for example, by sputtering a 200 angstrom thick layer of titanium and nickel onto the front side 76 of the X-ray mask 45. The thin conducting metal plating base layer 84 is slightly transparent to optical light. A photoresist layer 86 is spun-on to the top of the plating base layer 84. The X-ray mask 45 is then processed through a baking cycle to cure the photoresist layer 86.

Figure 11:
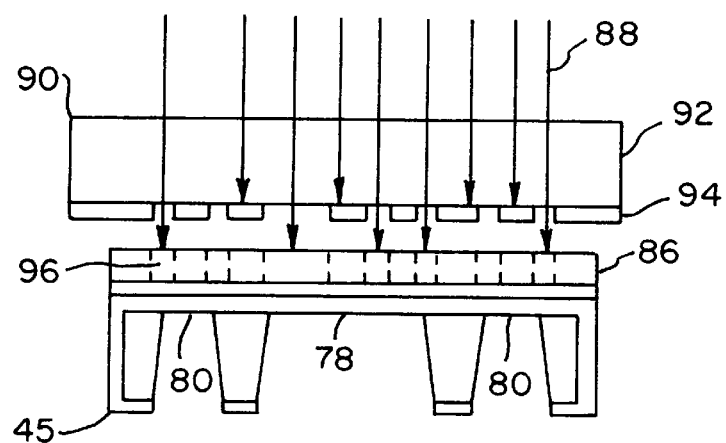
FIG. 11 is an illustrative view showing the X-ray mask wafer of FIG. 10 exposed through a master mask to UV light.

The cured photoresist layer 86 is exposed to UV light 88 through a master mask 90 as illustrated in FIG. 11. The master mask 90 includes a glass layer 92 upon which a non-transparent layer 94 is deposited. The non-transparent layer 94 is patterned, in this case, with the negative of desired microstructure device and alignment hole patterns. These patterns may be formed on the master mask 90 in a conventional manner, such as by laser etching of the non-transparent layer 94. Exposure of the photoresist layer 86 to UV light through the master mask 90 transfers the negative microstructure device and alignment hole patterns to the photoresist layer 86. Exposed portions 96 of the photoresist layer 86 are susceptible to removal by a developer.

The microstructure device pattern defined by the master mask 90 is transferred onto an area of the photoresist layer 86 corresponding to the device membrane 78 of the X-ray mask 45. This pattern defines the ultimate shape of the microstructure device layer to be formed on the device substrate 40. Details of the pattern will, of course, depend on the nature of the device to be fabricated.

Figure 12:
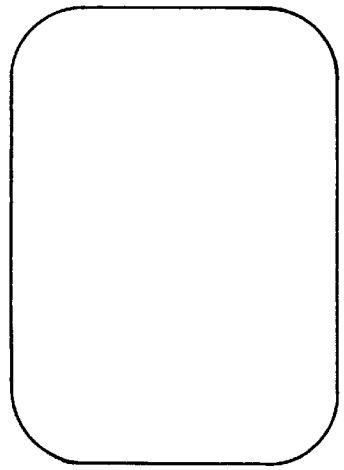
FIG. 12 illustrates the preferred shape of an alignment hole geometry formed in accordance with the method of the present invention.
Figure 13:
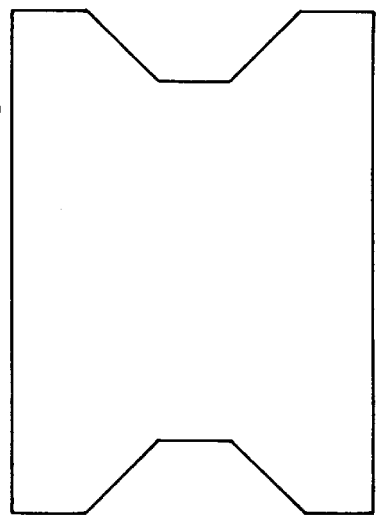
FIG. 13 illustrates an alternative alignment hole geometry formed in accordance with the method of the present invention.

Other portions of the pattern on the master mask 90 define the geometry of first alignment holes to be formed in the first photoresist layer 43 on the device substrate 40. These alignment hole patterns are transferred onto the areas of the photoresist layer 86 corresponding to the alignment structure membranes 80. Various alignment hole geometries may be used. Two possible geometries are illustrated in FIGS. 12 and 13. The alignment structure geometry illustrated in FIG. 13 is designed to provide many defined borders, to prevent twisting of the alignment structures when fully assembled. However, experimentation has shown that when this geometry is used to form alignment holes in the first photoresist layer 43 on the device substrate 40, there is an increased probability of cracks forming in the photoresist layer 43 at the corners of the alignment holes after solvent bonding of a second photoresist layer onto the first photoresist layer 43. These cracks in the area of the alignment holes can lead to additional alignment uncertainty. Alignment posts inserted into alignment holes with cracked corners could slide by an additional amount due to the gaps formed by the cracks. In order to minimize cracking of the first photoresist layer 43 attached to the device substrate 40, the alignment structure geometry illustrated in FIG. 12, with rounded corners, is preferably used for the alignment holes and posts.

In order to maximize the mechanical stability of the alignment system, the size of alignment structures is preferably maximized. Large alignment structures also ensure an easier assembly of X-ray masks onto to the first photoresist layer 43 on the device substrate 40. The exemplary alignment structure geometries illustrated in FIGS. 12 and 13 are approximately 5600 micrometers long and 4000 micrometers wide. Differently sized geometries may also be used, of course, it being understood that larger geometries will reduce the usable area of the X-ray mask 45 for the device area 63, and that smaller alignment structure geometries will be less stable and more difficult to assemble. In order to maximize available device space, it is preferable that the alignment geometry used nearly fill the entire available area of the alignment structure membranes 80. In other words, the alignment structure membranes 80 need not be made significantly larger than the alignment geometry to be employed. A separation between the alignment structure geometry and the alignment structure membrane 80 border of 1–2 millimeters along the sides, top, and bottom of the membrane 80 is sufficient to permit easy alignment of the master mask 90 with the alignment structure membranes 80 of the X-ray mask 45 during the process of making the X-ray mask.

Figure 14:
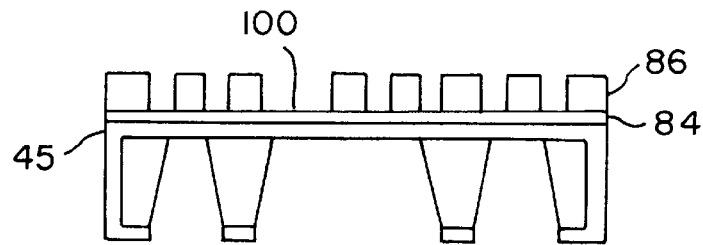
FIG. 14 is an illustrative view showing the X-ray mask wafer of FIG. 11 after development of the exposed photoresist layer formed on the front side thereof.
Figure 15:
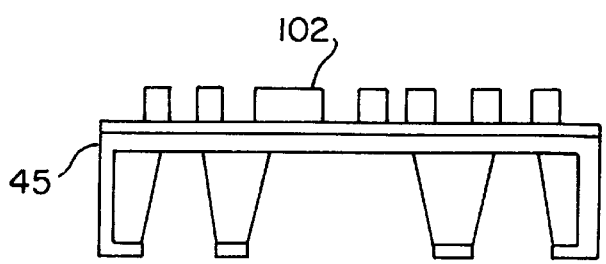
FIG. 15 is an illustrative view showing the X-ray mask wafer of FIG. 14 after an X-ray absorbing material has been electroplated onto the plating base layer into areas of the photoresist layer which were removed by development, and after removal of the remaining photoresist layer.

Processing of the X-ray mask 45 continues, as illustrated in FIG. 14, by developing the photoresist layer 86 to remove the exposed portions 96 therefrom. This exposes areas 100 of the plating base layer 84 in a pattern corresponding to the negative of the device pattern and alignment structure geometries. An X-ray absorbing material, such as gold, is then electroplated onto the plating base layer 84 into the areas 100 where the plating base 84 is exposed. Approximately 3 micrometers of gold may be electroplated to form a pattern of X-ray blocking material 102 on the X-ray mask 45. A completed first X-ray mask 45 is shown in FIG. 15, after deposition of the X-ray blocking pattern 102 and after the remaining portions of the photoresist layer 86 have been removed. The X-ray blocking pattern 102 formed on the X-ray mask 45 defines the device pattern and alignment structure geometries to be formed on the device substrate 40.

With respect to the foregoing description of an exemplary process for fabricating the first X-ray mask 45, it should be noted that certain steps, such as cleaning cycles between the steps that are described, and certain details of other steps, have not been described. However, these steps will be widely known to those having skill in the art. The steps used in forming the X-ray mask 45 are conventional. The formation of alignment structure membranes and alignment structure geometries on the X-ray mask 45, and their relationship to device membranes and microstructure device patterns on the mask 45 are, however, features of the present invention.

Figure 16:
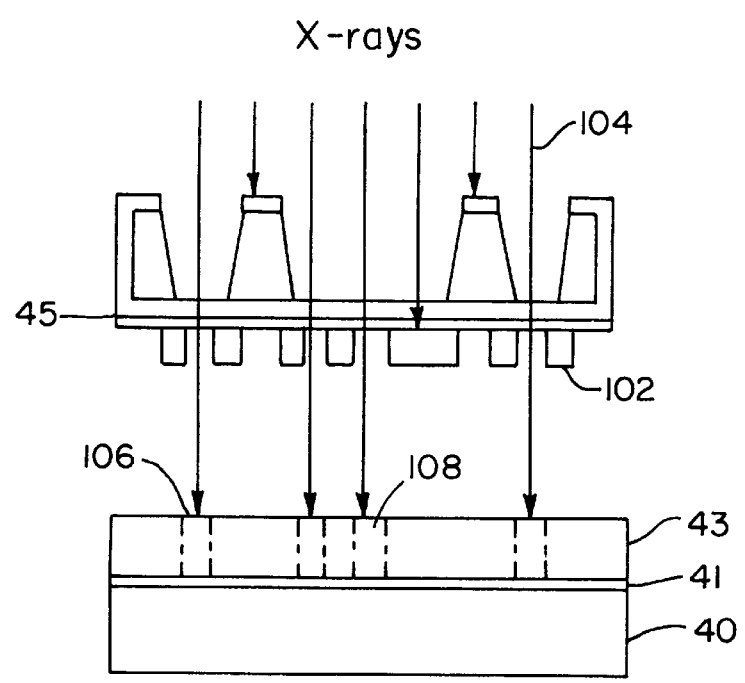
FIG. 16 is an illustrative view showing the substrate of FIG. 1 exposed through the X-ray mask of FIG. 15 to X-ray radiation.

As illustrated in FIG. 16, the first photoresist layer 43 on the device substrate 40 is exposed to X-rays through the first X-ray mask 45. The pattern of X-ray absorbing material 102 on the X-ray mask 45 prevents X-rays from impinging on the first photoresist layer 43, except in areas 108 corresponding to the microstructure device pattern and areas 106 corresponding to alignment hole geometries defined by the X-ray mask 45. Although exposure of the first photoresist layer 43 to X-ray radiation from a synchrotron source is preferred, to obtain structures of maximum depth and minimum run-out, it is apparent that the process may be used with other types of radiation, such as ultraviolet (UV) or non-synchrotron X-rays, where thinner structures are acceptable. (A photoresist layer 43 made of a material sensitive to the particular type of radiation used must be employed.)

The device substrate 40, with patterned first photoresist layer 43, is now processed to form a first layer of electroplated microstructure devices on the plating base 41 of the device substrate 40, and to form first alignment holes in the photoresist layer 43 that are free from any electroplated metal or other processing residues. Before developing the photoresist layer 43, the exposed portions 106 of the photoresist layer 43 corresponding to the first alignment holes are masked, such as with a masking tape 110, as illustrated in FIGS. 17 and 18. The photoresist layer 43 is then developed in a conventional manner to remove the exposed portions 108 of the photoresist layer 43 corresponding to the first layer microstructure device patterns therefrom. As illustrated in FIG. 19, the developing process removes the exposed portions 108 of the photoresist layer 43, to expose the plating base layer 41 in areas 112 corresponding to the first layer microstructure device patterns. The exposed areas 106 of the photoresist layer 43 corresponding to the first alignment holes to be formed in the photoresist layer 43, however, remain intact. Metal microstructures 114 are then electroplated onto the plating base layer 41 in the areas 112 from which the photoresist layer 43 was removed by the developing process. The resulting structure is illustrated in FIG. 20, after the masking tape 110 has been removed.

To fabricate a multi-layer metal microstructure using the LIGA process, a second metal microstructure layer will be deposited on the first layer metal microstructures 114. This requires that the upper surface of the first layer microstructures 114 be maximally flat. However, the electroplated microstructures 114 formed by the electroplating process will not typically have a flat surface. The surface of the electroplated structures 114 will tend to be concave in shape, with more material deposited around the walls of the wells formed in the first photoresist layer 43. A second concern is that the height of the electroplated microstructures 114 of the first layer be as nominally designed. It is difficult to control the electroplating process to provide electroplated structures 114 of the exact height desired. It is also preferable that the top surface of the first photoresist layer 43 itself be made maximally flat, to assure proper adhesion of a second photoresist layer on top of the first photoresist layer 43. Thus, to assure proper adhesion between the first layer microstructures 114 and first photoresist layer 43 and subsequent microstructure and photoresist layers, a replanarization process is preferably employed to form a maximally flat surface on the first layer of microstructures 114 and photoresist 43, and to reduce the first layer microstructures 114 to their designed height. Preferably, the surface of the first photoresist layer 43 and microstructures 114 is also polished to an optical finish by the replanarization step.

Replanarization of the surface of the first photoresist layer 43 and first layer microstructures 114 may be accomplished in a conventional manner, for example, by micromilling of the photoresist 43 and microstructure 114 surfaces. Flat photoresist 43 and microstructure 114 surfaces, at the desired microstructure height, may be obtained in this manner. However, conventional replanarization methods typically exert undesirable sheer forces on the photoresist layer 43 and microstructures 114. Thus, especially for tall narrow microstructure shapes, adhesion between the microstructures 114 and the plating base 41 may be lost during conventional replanarization.

A preferable method for replanarizing the photoresist layer 43 and microstructures 114 is a lapping process using a diamond containing lapping slurry. A lapping machine is furnished with a lapping plate made of a soft metal material. The lapping plate surface is furnished with ridges of controlled height using a diamond embedded conditioning ring with a specified grit size. Free diamonds in a liquid slurry are then sprayed onto the plate and embedded therein by a ceramic conditioning ring. After the lapping plate is conditioned, the surface of the photoresist layer 43 and first layer microstructures 114 is mounted against the lapping plate. The lapping plate is then rotated against the photoresist and microstructure layer surface. During the lapping process, additional diamond slurry is sprayed onto the lapping plate, and driven into the plate by the ceramic conditioning ring. The size of diamonds in the diamond lapping slurry is selected to control the sheer forces applied to the surface being lapped, and to achieve a desired surface finish. In this manner, material is removed from the surface of the first photoresist layer 43 and first metal microstructure layer 114 to planarize the surface and reduce the first layer microstructures 114 to their designed height. A polishing step, using a cloth covered hard metal polishing plate and loose diamond slurry, is preferably employed after lapping to provide a smooth optical surface finish to the first microstructure layer 114. This lapping and polishing process prepares the first photoresist layer 43 for adhesion of a second photoresist layer thereto, and prepares the first microstructure layer 114 for electroplating of a second microstructure layer thereon, while minimizing the risk of damage to either the first photoresist layer 43 or the first microstructure layer 114 due to excessive sheer forces.

After the surface of the first photoresist layer 43 and first microstructure layer 114 is replanarized, the first photoresist layer 43 is developed for a second time to remove the exposed portions 106 therefrom to form the first alignment holes 116. The resulting device substrate structure is illustrated in FIG. 21.

Variations on the described procedure for forming the device substrate structure illustrated in FIG. 21 may also be employed in accordance with the present invention. For example, the exposed areas 106 and 108 of the first photoresist layer 43, corresponding to first alignment hole geometries and first microstructure device patterns, respectively, may be removed at the same time by developing the first photoresist layer 43 in a single step. After development of the first photoresist layer 43, masking tape is placed over the first alignment holes 116. Electroplating of the first layer metal microstructures 114 then proceeds as described above. In this case, the masking tape prevents the alignment holes 116 from filling with metal during the electroplating process. The masking tape is then removed for replanarization of the metal microstructures 114. However, if the preferred lapping and polishing method described previously is used for replanarization, the diamond lapping and polishing slurry will inevitably fill into the alignment hole cavities 116. Experiments have shown that this slurry cannot be easily removed from the alignment holes 116 by scratching, flushing, vacuum suction, solvents, or detergents. The presence of slurry in the alignment holes makes assembly of the alignment structures of the present invention, which requires the insertion of alignment posts into the alignment holes 116, virtually impossible. A solution to this problem is to seal the first alignment holes 116 after electroplating, but before diamond slurry lapping, with exposed or unexposed photoresist. However, this typically leads to a compound of photoresist and diamond lapping slurry being embedded into the first alignment holes 116. This compound also cannot easily and completely be removed from the alignment holes 116 by conventional processing techniques, e.g., by using isopropanol.

Figure 22:
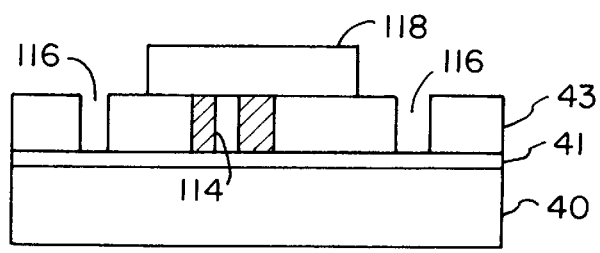
FIG. 22 is an illustrative side view of the substrate of FIG. 21 with a second photoresist layer formed thereon over the microstructures formed in the first photoresist layer.

After the first photoresist layer 43 and microstructure layer 114 are replanarized, and thoroughly cleaned, a second photoresist layer 118 is applied onto the first photoresist layer 43. As illustrated in FIG. 22, the second photoresist layer 118 is preferably formed from a preformed photoresist sheet of desired thickness that is solvent bonded onto the first photoresist layer 43 over the first layer of microstructures 114. As described previously, solvent bonding may preferably be accomplished by spinning a thin layer of liquid PMMA onto the upper surface of the first photoresist layer 43 and first layer microstructures 114. A photoresist sheet is then applied over this spun-on layer of liquid photoresist to form the second photoresist layer 118. During spinning on of the thin liquid photoresist layer, the alignment holes 116 are preferably masked, such as with masking tape in the manner described previously with respect to FIGS. 17 and 18, to prevent the first alignment holes 116 from filling with the liquid photoresist. The size of the area around the first alignment holes 116 that should be masked during application of the liquid photoresist layer is preferably at least as large as the size of photoresist spacer sheets that may be used for assembling a second X-ray mask onto the first photoresist layer 43. The use of photoresist spacer sheets in the method of the present invention will be described in more detail below.

It should be apparent that the size of the photoresist sheet used to form the second photoresist layer 118 is smaller than that of the photoresist sheet used to form the first photoresist layer 43. The second photoresist layer 118 must, of course, not cover the first alignment holes 116. In addition, the size of the second photoresist sheet must provide sufficient space between the second photoresist layer 118 and the alignment holes 116 to accommodate mask photoresist layers attached to the second X-ray mask which, as described in more detail below, contain mask alignment holes that are aligned with the first alignment holes 116 in the first photoresist sheet 43. Thus, for example, for a first photoresist layer sheet size of 63×35 millimeters, the photoresist sheet size for the second photoresist layer 118 may be selected to be 32×30 millimeters.

With the second photoresist layer 118 applied to the first photoresist layer 43, the device substrate is prepared for the formation of a second layer of microstructure devices. The first step in the formation of a second microstructure device layer is patterning of the second photoresist layer 118. The second layer microstructure device pattern is defined by a pattern of X-ray blocking material on a second X-ray mask. The second X-ray mask will be fabricated in essentially the same manner as the first X-ray mask. Thus, for hard X-ray exposures, the mask may be formed of microstructure device and alignment hole geometry mask patterns formed on device and alignment structure areas, respectively, of a thick silicon substrate. We will continue, however, with the exemplary use of a soft X-ray mask. The fabrication of the second soft X-ray mask may be accomplished in the same manner as described previously with respect to the first X-ray mask. Thus, a silicon wafer covered by a layer of silicon nitride is patterned and etched to form device and alignment structure membranes. The same layout of device and alignment structure areas as was used in the fabrication of the first X-ray mask is used for the fabrication of the second X-ray mask. A master mask is then used to form a pattern of X-ray blocking material on the second X-ray mask in the membrane areas. The mask pattern in the device membrane area of the second X-ray mask defines the second layer microstructure device pattern to be formed. The mask patterns in the alignment structure membrane areas of the second X-ray mask define exactly the same geometries as were used to form the first alignment holes 116 in the first photoresist layer 43. Since the masking and exposure processes used to form the microstructure device patterns and the alignment hole geometries on the second X-ray mask are carried out simultaneously, the relative positions of the alignment hole geometries with respect to the microstructure device patterns is precisely controlled. This relationship is defined by the master mask used to pattern the second X-ray mask such that, when the alignment hole geometries defined by the second X-ray mask are aligned with the alignment hole geometries defined by the first X-ray mask (which were used to form the first alignment holes 116), the microstructure device patterns defined by the first and second X-ray masks will also be aligned.

Figure 23:
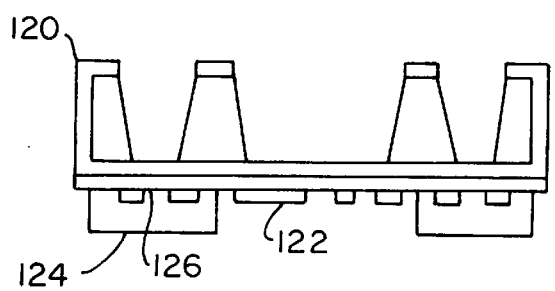
FIG. 23 is an illustrative side view of a second X-ray mask with mask photoresist layers attached directly over alignment structure membrane areas formed on the front side thereof.

As illustrated in FIG. 23, the second X-ray mask 120 includes X-ray absorbing material 122 formed thereon in a pattern which defines both the second layer microstructure device pattern and alignment hole geometries for the second X-ray mask 120. In accordance with the present invention, the second X-ray mask 120 is aligned with the first photoresist layer 43 on the device substrate 40 by alignment posts used to align the alignment holes 116 in the first photoresist layer 43 with mask alignment holes formed in mask photoresist layers attached to the second X-ray mask 120. The mask alignment holes in the mask photoresist layers are formed by first attaching photoresist sheets to the second X-ray mask 120 in positions whereby the mask photoresist layers may be exposed to X-rays through the alignment hole geometry pattern defined by the second X-ray mask 120.

There are several alternative procedures for attaching mask photoresist layers to the second X-ray mask 120. A first alternative, as illustrated in FIG. 23, is to glue photoresist sheets 124 directly onto the alignment structure areas of the mask. In this case, care must be taken to ensure that the alignment structure membranes 126 do not crack due to the glue-down procedure. Also, care must be taken to prevent breaking of the alignment structure membranes 126 during the process of exposing the mask photoresist layers 124 to X-rays through the X-ray mask 120. Bubbling of the photoresist layer 124 during X-ray exposure may crack the alignment structure membrane 126. Of course, the problem is avoided for hard X-ray masks that do not require thin and fragile membranes in the patterned areas thereof to allow X-rays to pass through the mask.

Figure 24:
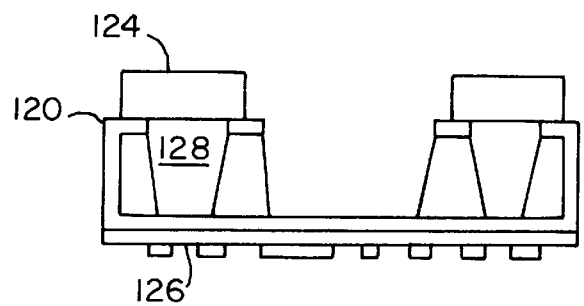
FIG. 24 is an illustrative side view of an alternative embodiment second X-ray mask with mask photoresist layers attached to the back side thereof over areas corresponding to the alignment structure membrane areas of the X-ray mask.

A second alternative procedure for attaching the mask photoresist layers 124 to the second X-ray mask 120 is to glue photoresist sheets 124 to the back side of the X-ray mask 120, as illustrated in FIG. 24. As shown, the photoresist sheets 124 are attached to the back side of the second X-ray mask 120 in alignment with the alignment membranes 126. This procedure involves some complex steps, and a more complicated X-ray mask fabrication sequence than other available procedures. Since X-ray exposures are performed in a vacuum, air captured in the spaces 128 between the alignment structure membranes 126 and mask photoresist layers 124 could expand during the X-ray exposure process and break the alignment structure membranes 126. Therefore, a hole would need to be drilled into the center of the mask photoresist layers 124, in an area of the photoresist sheets 124 which is to be exposed to X-rays and removed by development, before the photoresist sheets 124 are glued down to the X-ray mask 120, to enable air in the cavities 128 to escape. After developing, the removal of developer that seeps into the cavities 128 between the mask photoresist sheets 124 and the alignment structure membranes 126 could be difficult. Furthermore, this procedure introduces an additional gap between the mask photoresist layers 124 and the patterned alignment structure membranes 126. Although synchrotron X-rays provide highly collimated exposures, there will be some X-ray exposure run-out over the approximately 400 micrometer distance typically separating the mask photoresist layers 124 and alignment structure membranes 126. Thus, the mask alignment holes formed in the mask photoresist layers 124 attached to the second X-ray mask 120 will be slightly larger than the alignment hole geometries defined by the mask pattern. This will result in decreased alignment accuracy unless the size of the alignment hole geometries defined by the mask pattern is adjusted to compensate for this run-out effect. Finally, if the mask photoresist layer 124 is attached to the back side of the X-ray mask 120, the X-ray mask 120 must be used "upside down" to align the second X-ray mask 120 with the first photoresist layer 43 on the device substrate 40. Thus, the layout of the second x-ray mask pattern will be the mirror image of the mask pattern which would normally be used if the mask photoresist layers 124 were attached to the front side of the second X-ray mask 120. Some of these problems may be avoided for hard X-ray masks, which may be formed on solid thick silicon wafers, and which do not have thin membranes or cavity structures.

Figure 25:
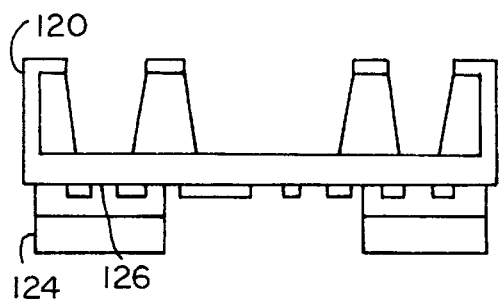
FIG. 25 is an illustrative side view of a second X-ray mask with mask photoresist layers attached to the front side thereof elevated over the alignment structure membrane areas.
Figure 26:
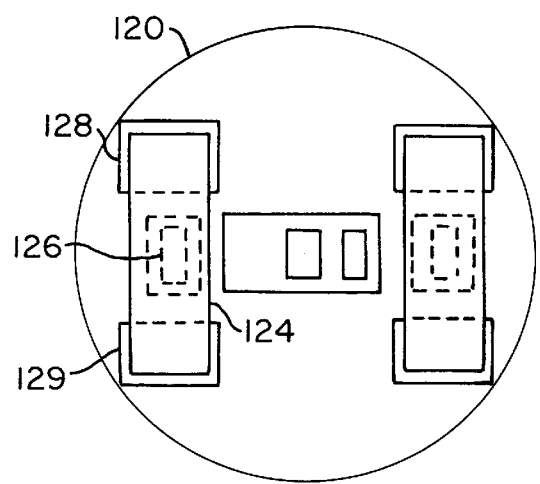
FIG. 26 is an illustrative plan view of the second X-ray mask of FIG. 25.

The preferred procedure for attaching the mask photoresist layers 124 to the X-ray mask 120 is illustrated in FIGS. 25 and 26. In this embodiment, the mask photoresist layers 124 are attached to the front side of the X-ray mask such that they are elevated over the alignment structure membranes 126. This is achieved, as illustrated best in FIG. 26, by gluing rectangular photoresist sheets 128 and 129 to the front side of the second X-ray mask 120, outside of the alignment structure areas 126. Then, longer sheets of photoresist 124, of approximately the same width as the first sheets of photoresist 128 and 129, are glued to the sheets 128 and 129 which are attached to the second X-ray mask 120 to form the mask photoresist layers 124. The mask photoresist layers 124 thus extend over the alignment structure membrane areas 126 on the front side of the X-ray mask and are separated therefrom. This preferred procedure does require additional photoresist cutting and solvent bonding steps.

Figure 27:
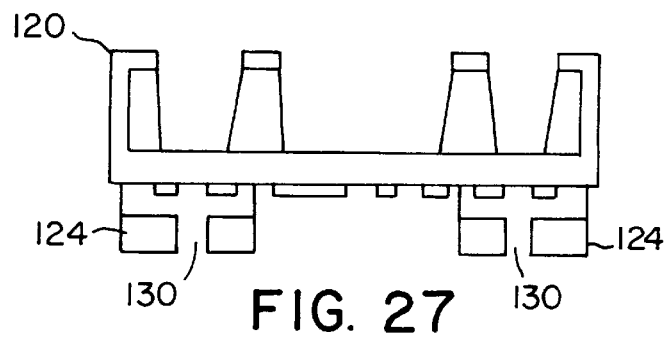
FIG. 27 is an illustrative side view of the second X-ray mask of FIG. 25 after the mask photoresist layers attached thereto have been exposed to X-ray radiation through the X-ray mask and developed to form mask alignment holes in the mask photoresist layers.

The mask photoresist layers 124 attached to the second X-ray mask 120 are exposed to X-rays through the X-ray mask pattern. This causes a portion of the mask photoresist layers 124, corresponding to the mask alignment hole geometries defined by the X-ray mask pattern, to become susceptible to removal by a developer. During the development step, the relatively large gap between the mask photoresist layer 124 and the alignment structure membranes 126 provides for a rather large flow of developer between the photoresist layers 124 and the membranes 126. As illustrated in FIG. 27, exposure and development of the mask photoresist layers 124 form mask alignment holes 130 in the mask photoresist layers 124 attached to the second X-ray mask 120. The mask alignment holes 130 in the mask photoresist layers 124 on the second X-ray mask 120 have the same geometry as the first alignment holes 116 in the first photoresist layer 43 on the device substrate 40.

In accordance with the present invention, alignment of the second X-ray mask 120 with the first photoresist layer 43 is achieved by assembling the second X-ray mask 120 onto the first photoresist layer 43 using alignment posts to connect the first alignment holes 116 on the first photoresist layer 43 with the mask alignment holes 130 in the mask photoresist layer 124 attached to the second X-ray mask 120. The alignment posts, therefore, must have the same geometry as the alignment holes 116 and 130. The alignment posts may be made of metal using a conventional LIGA fabrication process employing a sacrificial layer to free electroplated metal alignment posts from the substrate on which they are formed. Alternatively, and preferably, the alignment posts may be fabricated of a photoresist material, such as PMMA. An exemplary procedure for fabricating photoresist alignment posts is described with reference to FIGS. 28–31.

Figure 28:
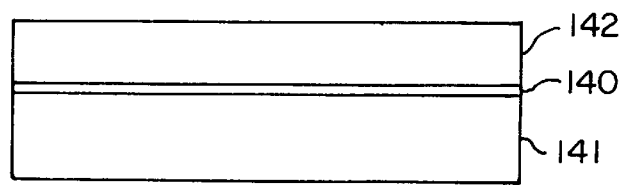
FIG. 28 is a simplified illustrative side view of a substrate with a sacrificial layer formed thereon and a photoresist sheet adhered to the sacrificial layer.

Referring initially to FIG. 28, the process of fabricating a photoresist alignment post begins with the application of a thin sacrificial layer 140 onto a substrate 141. The substrate 141 typically has a planar surface on which the sacrificial layer 140 is formed, and may be made of a variety of materials, e.g., silicon wafer, glass, metal, or various plastics. The material of the sacrificial layer 140 may be any of a variety of materials which is resistant to attack from a photoresist developer. For example, where the photoresist is PMMA, the sacrificial layer of material must be resistant to a typical PMMA developer such as morpholine, 2-(2-butoxyethoxy) ethanol, ethanolamine, and water. The sacrificial layer of material 140 must also be selectively removable by a remover which does not attack the photoresist, e.g., PMMA. For a PMMA photoresist, examples of suitable sacrificial layers are titanium (sputtered onto the substrate), which can be removed with dilute hydrofluoric acid, and partially imidized polyimide (which is spun on the substrate), with a suitable remover for the polyimide being ammonium hydroxide. A soft PIRL polyimide material can also be used as the sacrificial layer. A preformed strain free photoresist sheet is preferably adhered to the sacrificial layer 140, such as by solvent bonding to form a photoresist layer 142. The photoresist layer 142 may be milled down, if necessary, to reach a desired alignment post height that is less than the initial photoresist sheet thickness.

Figure 29:
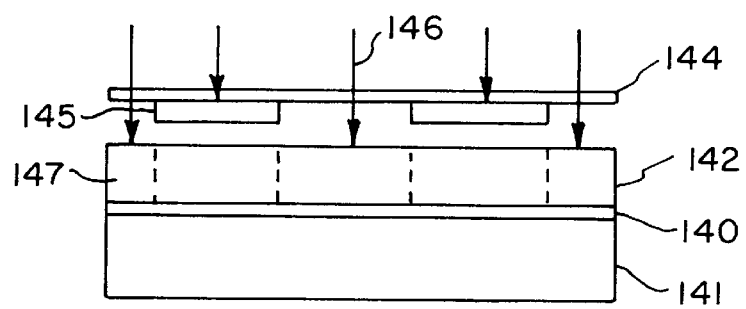
FIG. 29 is an illustrative view showing the photoresist and substrate of FIG. 28 exposed to X-ray radiation through an X-ray mask pattern defining alignment post geometries.
Figure 30:
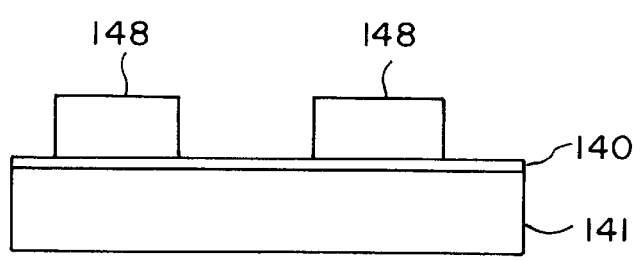
FIG. 30 is an illustrative view showing the substrate and photoresist of FIG. 29 after the exposed photoresist has been developed to form free standing alignment posts attached to the substrate.

As illustrated in FIG. 29, an X-ray mask 144, having X-ray absorbing patterns 145 formed thereon, provides a pattern exposure from synchrotron radiation X-rays 146 to provide exposed patterns 147 in the photoresist layer 142. The X-ray mask pattern 145 defines the geometry of the alignment posts, e.g., one of the geometries illustrated in FIG. 12 or FIG. 13, which is identical to the geometry of the alignment holes 116 and 130 formed in the first photoresist layer 43 on the device substrate 40 and the mask photoresist layers 124 on the second X-ray mask 120, respectively. The exposed photoresist 147 is then developed using a high selectivity developer, as described above, to remove the exposed photoresist 147, leaving, as illustrated in FIG. 30, isolated alignment post structures 148 adhered to the sacrificial layer 140. A remover of the sacrificial layer 140 is then applied to the sacrificial layer 140 on the substrate 141 to selectively etch away the sacrificial layer 140, thereby freeing the alignment posts 148 from the substrate.

Figure 31:
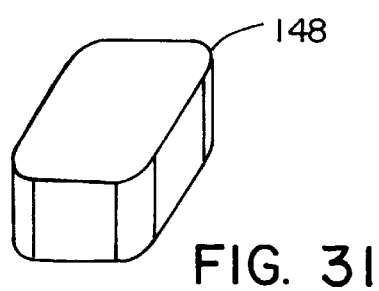
FIG. 31 is a perspective view of an alignment post for use in accordance with the present invention.

An exemplary free alignment post 148 formed by the foregoing process, and having an alignment post geometry approximately corresponding to that illustrated in FIG. 12, is illustrated in FIG. 31. Because a substantially strain free preformed photoresist sheet is preferably used to form the alignment posts 148, the alignment posts 148 will have substantially no internal strain when freed from the substrate 141, and therefore will not substantially mechanically distort. This is desirable for maintaining alignment accuracy between the second X-ray mask 120 and the first photoresist layer 43 on the device substrate 40 using the alignment posts 148.

Another process which may be used to fabricate photoresist alignment posts 148 is to expose a free preformed PMMA sheet, i.e., a PMMA sheet not attached to a substrate, to X-rays through an X-ray mask that defines the alignment post geometries. Development of the exposed photoresist sheet then automatically produces the alignment posts 148. This process eliminates the need for applying a photoresist sheet to a substrate and the steps of etching or dissolving a sacrificial layer to free the formed alignment posts 148 from the substrate. However, since the photoresist alignment posts 148 are not attached to a substrate, and are automatically freed by development of the photoresist sheet, they may easily become lost during the development cycle. Hence, precautions, such as use of a sieve, are needed for the use of this procedure.

Figure 32:
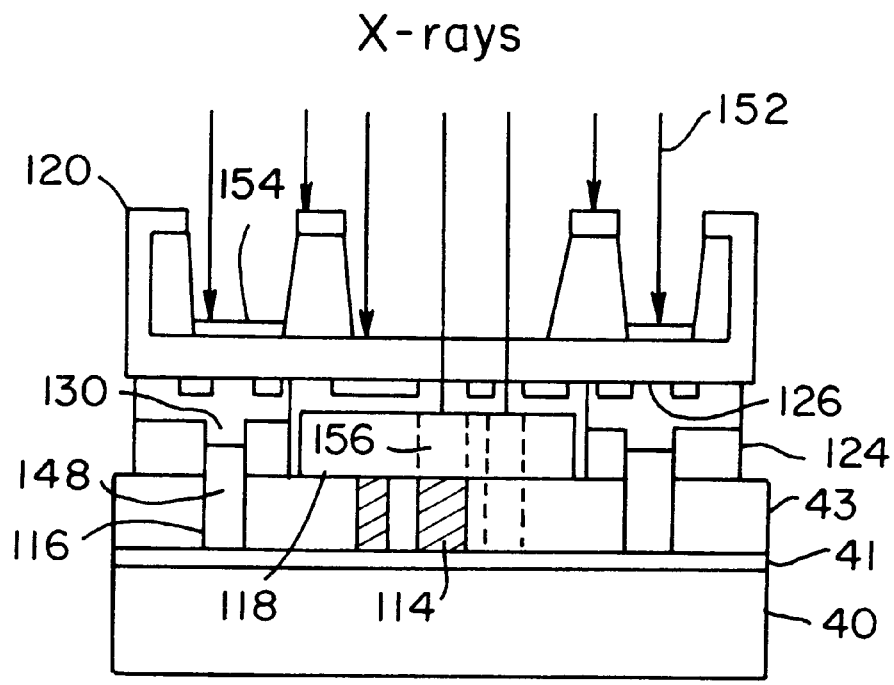
FIG. 32 is an illustrative side view of an assembly of the second X-ray mask of FIG. 27 aligned with the substrate of FIG. 22 using alignment posts in accordance with the present invention, with the substrate photoresist layers exposed to X-ray radiation through the aligned second X-ray mask.

The second X-ray mask 120 is aligned with the first photoresist layer 43 on the device substrate 40 by assembling the second X-ray mask 120 onto the first photoresist layer 43 using the alignment posts 148, as illustrated in FIG. 32. No specialized equipment is required to achieve alignment between the second X-ray mask 120 and the first photoresist layer 43. Accurate alignment automatically results from assembly of the second X-ray mask 120 onto the first photoresist layer 43 using the alignment posts 148. Assembly can be easily accomplished within a few minutes at the X-ray exposure site.

The steps of the assembly procedure are as follows. First, alignment posts 148 are placed into each of the alignment holes 116 in the first photoresist layer 43 on the device substrate 40. The alignment posts 148 may be placed into the alignment holes 116 using a tweezers. The alignment posts 148 extend from the alignment holes 116 above the surface of the first photoresist layer 43 on the device substrate 40. The second X-ray mask 120 is then carefully placed over the first photoresist layer 43 on the device substrate 40. Contact of parts extending from the first photoresist layer 43, including the alignment posts 148 and second photoresist layer 118, with the second X-ray mask device membrane, must be avoided. The X-ray mask 120 is then slid until the mask alignment holes 130 are over the alignment posts 148 and the alignment posts 148 penetrate into the mask alignment holes 130. During this assembly process, the alignment structure membranes 126 in the second X-ray mask 120 might break. However, only the device membrane in the second X-ray mask 120 is needed for exposure of the second photoresist layer 118. The mask alignment holes 130 in the mask photoresist layers 124 on the X-ray mask 120 already incorporate the desired alignment hole geometry. Hence, the alignment structure membranes 126 may be broken on purpose to allow the mask alignment holes 130 and the alignment posts 148 to be seen clearly during the assembly process.

Alignment of the second X-ray mask 120 with the first photoresist layer 43 by the assembly procedure of the present invention results in accurate alignment between the microstructure device mask pattern on the second X-ray mask 120 and the microstructure device pattern on the first photoresist layer 43. Factors which can adversely affect alignment accuracy, and methods of compensating for and/or minimizing the effect of these factors, will now be discussed briefly.

Figure 33:
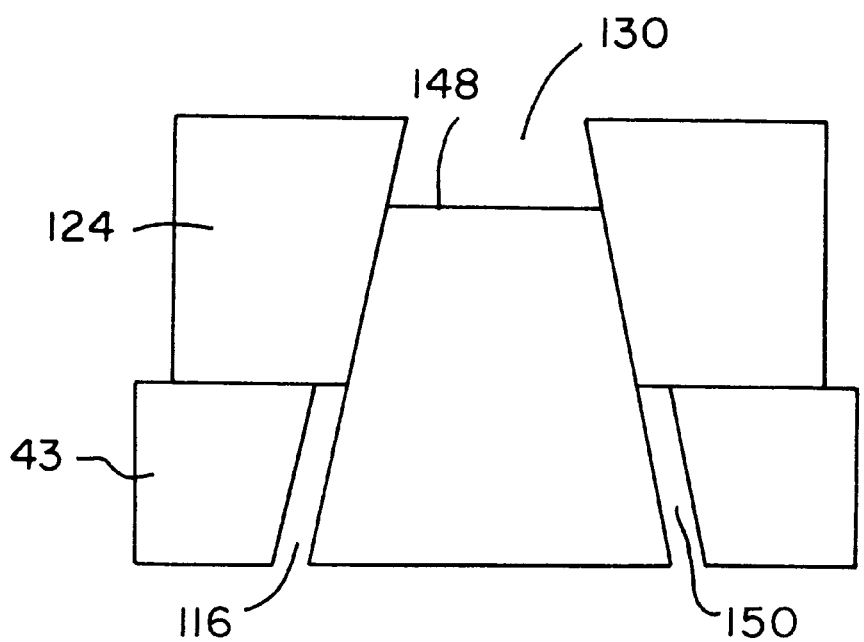
FIG. 33 is a detailed illustrative side view of an alignment post joining together mask alignment holes in a second X-ray mask and first alignment holes in a first photoresist layer on a substrate.

During X-ray exposure of a photoresist layer, beam divergence occurs, which leads to slight run-outs in the sidewalls of the structures being produced. For synchrotron source X-rays, run-outs are typically on the order of 0.1 micrometers per 100 micrometers of X-ray exposure depth. In the process of fabricating the alignment structures of the present invention, run-outs occur at three different steps: exposure of the first photoresist layer 43 on the device substrate 40, exposure of the mask photoresist layers 124 attached to the second X-ray mask 120, and in the fabrication of the alignment posts 148. There are two different categories of run-outs: runouts within a single photoresist layer, and run-outs between an X-ray mask and a photoresist layer due to the exposure gap between the mask and the photoresist layer. Run-outs due to the exposure gap can be compensated for by a mask pattern which is adjusted in size laterally by the gap times the run-out. This adjustment of the lateral size of the mask pattern will result in an exposure of the photoresist layer across the exposure gap which corresponds to the desired nominal size of the structure to be produced. Run-outs within a photoresist layer itself, however, cannot be compensated. The effect of these run-outs on the alignment structure of the present invention is illustrated schematically in FIG. 33. This figure shows a schematic cross-sectional view of an alignment post 148 assembled in the alignment holes 116 and 130 in the first photoresist layer 43 on the device substrate 40 and in a mask photoresist layer 124 on the X-ray mask 120, respectively. The run-out angles shown in FIG. 33 are exaggerated for purposes of illustration. Ideally, the alignment post 148 is laid out to fit exactly into the first alignment hole 116 in the first photoresist layer 43 on the device substrate 40. However, due to X-ray exposure run-out, this is difficult to achieve. This results in a small gap 150 between the alignment post 148 and the walls of the first alignment hole 116. A small gap may also remain between the walls of the mask alignment hole 130 and the alignment post 148. The effect of the gap 150 between the first photoresist layer 43 on the device substrate 40 and the alignment post 148 can be calculated, ignoring all other effects. Assuming a 150 micrometer thick first photoresist layer 43, the lateral run-out resulting from synchrotron source X-ray exposure is approximately 0.15 micrometers. X-ray exposure run-out within the first photoresist layer 43 is, therefore, certainly not a main contributor to alignment errors. Hence, this is not a main area of concern. However, it is important to keep the effect of X-ray exposure run-out over the exposure gap in mind. Run-outs from a 400 micrometer gap are in the 0.5 micrometer range. This, combined with other effects, represents a more significant influence on alignment accuracy. However, as discussed previously, the effect of the exposure gap can be compensated for during layout of the X-ray mask patterns. Also, since run-outs and processing variables reduce the effective post size 148, a small overdimensioning of the posts 148 leads to a better press-fit assembly of the second X-ray mask 120 onto the first photoresist layer 43, and hence to a better alignment accuracy.

Another potential cause of alignment inaccuracy is temperature variation between different steps of the alignment structure fabrication procedure. For example, if the temperature during exposure of the first photoresist layer 43 on the device substrate 40 is different from the temperature during exposure of the mask photoresist layer 124 on the second X-ray mask 120, a shift of alignment structures could occur. This is caused by thermal expansion or contraction of either the mask or the substrate. This results in different relative positions of the alignment holes 130 and 116 on the mask and substrate. This misalignment could make it difficult to assemble the second X-ray mask 120 onto the first photoresist layer 43. One way to deal with these unexpected processing inaccuracies is to fabricate multiple alignment posts 148 having the same geometry but of slightly different sizes. For example, alignment posts that are 0, 1, 2, and 4 microns smaller than the desired size of the alignment holes 116 and 130 may be produced. (To distinguish between the different sizes of posts, holes may be added to the posts 148 for identification purposes.) one of these alignment post sizes should allow for assembly of the second X-ray mask 120 onto the first photoresist layer 43, without dramatically affecting the alignment accuracy. However, the best solution is to minimize unexpected processing inaccuracies, by maintaining constant temperatures through each of the photoresist exposure steps described.

Referring once again to FIG. 32, the X-ray mask 120 and device substrate 40 may be secured together, after assembly using the alignment posts 148, by taping the mask 120 to the device substrate 40. The assembly of second X-ray mask 120 and device substrate 40 is then clamped, in a conventional manner, for exposure of the second photoresist layer 118 to X-rays 152 through the second X-ray mask 120. (To ensure that the X-ray mask 120 does not crack from the clamping force, two spacer sheets (not shown) may be placed between the substrate 40 and the X-ray mask 120 outside of the device and alignment structure membrane areas.) Before exposure of the second photoresist layer 118 to X-rays 152, the alignment structure membrane areas on the second X-ray mask 120, which may now be broken, are preferably masked, such as with masking tape or resist 154, to prevent the alignment posts 148 from being exposed to X-rays and from falling out of the alignment holes 116 and 130 through the X-ray mask 120 during X-ray exposure. During X-ray exposure, the scanning width of the X-ray beam may also preferably be adjusted so that only the photoresist under the device membrane of the second X-ray mask 120 is exposed.

Exposure of the second photoresist layer 118 to X-rays 152 through the second X-ray mask 120 transfers the second layer microstructure device pattern from the X-ray mask 120 to the second photoresist layer 118. For electroplating of second layer microstructures, the exposed portions 156 of the second photoresist layer 118 must correspond to previously deposited metal microstructures 114 in the first layer of photoresist 43, which are used as a plating base for the second microstructure layer. Alternatively, X-ray exposure through the second X-ray mask 120 may be allowed to proceed for a sufficient duration to expose through both the second 118 and first 43 photoresist layers on the device substrate 40. This will permit metal microstructures to be electroplated directly onto the plating base layer 41.

In the alignment structure assembly of FIG. 32, the thickness of the second photoresist layer 118 on the device substrate 40 is limited to a little less than the total height of the photoresist sheets 124 and 128/129 (see FIG. 26) attached to the second X-ray mask 120. If the second photoresist layer 118 is almost as thick as the total height of the photoresist sheets 124 and 128/129 on the second X-ray mask 120, the exposure dose needs to be accurately adjusted. This is because an exposure dose that leads to overexposure and bubbling of the second photoresist layer 118 may crack the device membrane of the second X-ray mask 120. To accommodate different thicknesses for the second photoresist layer 118, there is some flexibility in the thickness of the photoresist sheets 124 and 128/129 that may be attached to the second X-ray mask 120. Thicker photoresist sheets 124 and 128/129 attached to the second X-ray mask 120 enable larger second photoresist layers 118 to be used on the device substrate 40.

Figure 34:
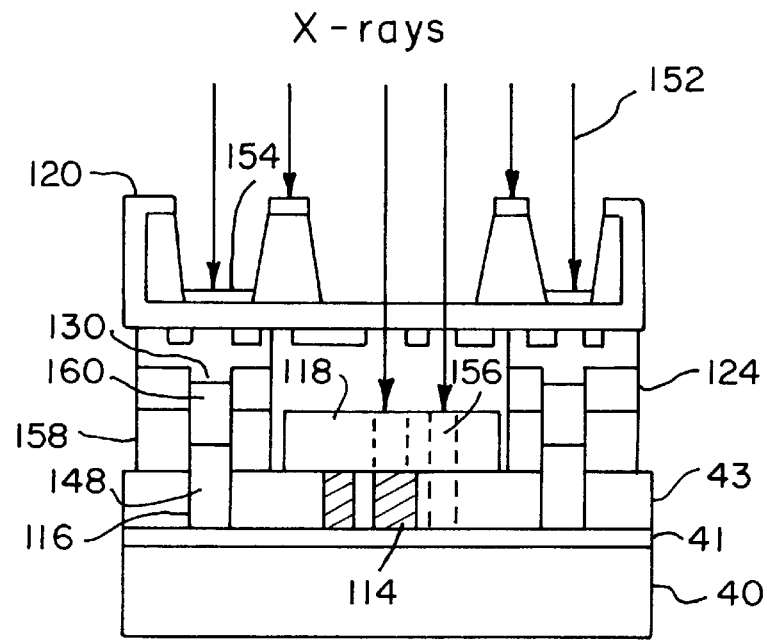
FIG. 34 is an illustrative side view of an assembly of the second X-ray mask of FIG. 27 aligned with the substrate of FIG. 22 using spacer sheets and multiple stacked alignment posts in accordance with the present invention, with the photoresist layers on the substrate exposed to X-ray radiation through the second X-ray mask.

To extend the alignment procedure of the present invention to accommodate larger exposure gaps between the second X-ray mask 120 and the second photoresist layer 118, thicker second photoresist layers 118, or more than one additional photoresist layer on the device substrate 40, spacer sheets 158 may be used, as illustrated in FIG. 34. The spacer sheets 158 may be made out of photoresist, such as PMMA, in the same manner as the alignment posts 148. The spacer sheets 158 include central apertures which correspond in geometry to that of the alignment holes 116 and 130 in the first photoresist layer 43 on the device substrate 40 and in the mask photoresist layer 124 attached to the second X-ray mask 120. Thus, the central apertures of the spacer sheets 158 are designed to accommodate the alignment posts 148.

The steps for assembly of the structure illustrated in FIG. 34 are as follows. First, alignment posts 148 are placed into each of the alignment holes 116 in the first photoresist layer 43 on the device substrate 40. Spacer sheets 158 are then placed onto the alignment posts 148, which extend from the surface of the first photoresist layer 43, such that the alignment posts 148 extend into the central apertures of the spacer sheets 158. Additional alignment posts 160 are then placed into the remaining space in the central apertures of the spacer sheets 158. The second X-ray mask 120 is then carefully placed over the device substrate 40 until the second alignment posts 160, extending from the spacer sheets 158, penetrate into the alignment holes 130 on the second X-ray mask 120. Securing of the X-ray mask 120 to the device substrate 40, and exposure of the second photoresist layer 118 to X-rays 152 through the X-ray mask 120, then proceed as described above with respect to FIG. 32. It is apparent that the use of multiple spacer sheets 158, or thicker spacer sheets 158, will allow the alignment procedure of the present invention to be extended to accommodate almost any exposure gap, second photoresist layer thickness, or number of additional photoresist layers attached to the device substrate 40 desired. To provide additional stability and alignment accuracy to the structure illustrated in FIG. 34, a single longer alignment post may be used in place of the two stacked alignment posts 148 and 160.

Figure 35:
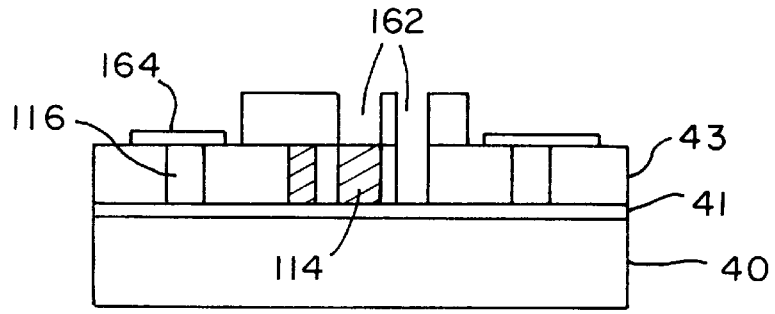
FIG. 35 is an illustrative side view of the substrate of FIG. 32 or 34 after the exposed photoresist layers have been developed.

After the second photoresist layer 118 has been exposed to X-rays 152 through the second X-ray mask 120, the exposed portions 156 of the second photoresist layer 118 (and, if appropriate, of the first photoresist layer 43) are removed by a development process as described previously. The resulting structure is illustrated in FIG. 35. As shown, the development process exposes the first layer metal microstructures 114 (and plating base layer 41) in areas 162 onto which the second layer metal microstructures are to be electroplated. During the subsequent electroplating step, the first alignment holes 116 in the first photoresist layer 43 are preferably masked with tape 164, to prevent metal microstructures from being formed therein. This preserves the first alignment holes 116, allowing third and subsequent X-ray masks to be aligned with the first photoresist layer 43 by alignment posts extending between the first alignment holes 116 in the first photoresist layer 43 and corresponding mask alignment holes formed in mask photoresist layers attached to the subsequent X-ray masks in the manner described previously with respect to the second X-ray mask 120. The first alignment holes 116 should also be covered to keep them free from any debris resulting from the replanarization of the second or subsequent microstructure layers.

Figure 36:
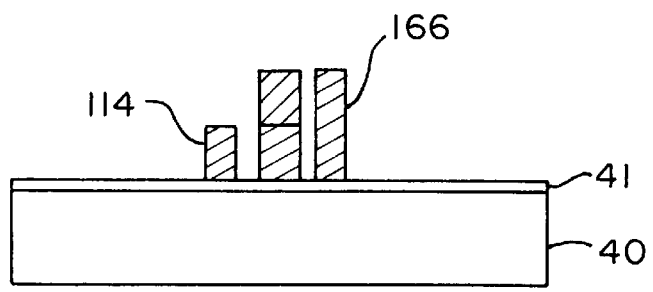
FIG. 36 is an illustrative view of the substrate of FIG. 35 with multi-layer microstructures formed thereon in portions of the photoresist layers removed during developing, and after remaining portions of the photoresist layers have been removed.

The first and second photoresist layers 43 and 118 may be removed after electroplating of the second layer metal microstructures 166. This results, after clean-up, in the structure illustrated in FIG. 36, wherein free standing multi-layer metal microstructures are formed on the device substrate 40. Freed multi-layer microstructures may be produced by use of a sacrificial layer between the plating base 41 and substrate 40 which, at this point, would be etched away to free the multi-layer microstructures from the substrate 40.

The accuracy of the alignment procedure of the present invention has been verified by the experimental fabrication of multi-layer metal microstructures by the LIGA fabrication process and employing the alignment procedure. Alignment accuracies of significantly better than 4 microns have been achieved. Alignment accuracies in the sub-micron range are achievable using the alignment procedure of the present invention by better controlling the alignment accuracy variables described previously, such as temperature variations and X-ray exposure run-out. Since no specialized alignment equipment is required for the alignment procedure of the present invention, the present invention provides a low cost procedure for achieving highly accurate alignment of X-ray masks with device substrates.

It is apparent that the present invention is not limited to the exemplary application of the fabrication of multi-layer metal microstructures using the LIGA process as described in detail herein. The alignment procedure of the present invention may be employed wherever the alignment of multiple masks with a substrate is required. Thus, the present invention may be used for the accurate fabrication of multi-layer metal microstructures, photoresist microstructures, or photoresist laminates having microstructures formed therein. In addition, the alignment procedure of the present invention may be used in the fabrication of single layer microstructures of metal or photoresist wherein multiple exposures of a single photoresist layer through multiple masks are required. Where hard X-ray exposures are employed, microstructure devices may be fabricated in accordance with the present invention by aligning the X-ray mask using alignment holes in a first photoresist sheet attached to one side of a device substrate, and then exposing through the substrate to pattern a photoresist layer, or a series of photoresist layers, attached to the side of the device substrate opposite the mask. The alignment procedure of the present invention is also applicable to integrated circuit fabrication and, particularly, is compatible with the fabrication of microstructures on substrates upon which integrated circuits have previously been formed.

It is thus understood that the present invention is not confined to the particular embodiments and exemplary applications set forth herein as illustrative, but embraces such modified forms thereof as come within the scope of the following claims.

What is claimed is:

1. A radiation mask adapted to be aligned with a photoresist layer, comprising:
   (a) a device area made of a radiation transmitting material;
   (b) radiation blocking material formed in the device area of the mask in a pattern defining a microstructure device;
   (c) an alignment structure area;
   (d) radiation blocking material formed in the alignment structure area in a pattern defining a mask alignment hole geometry; and
   (e) a mask photoresist layer attached to the mask over the alignment structure area and having mask alignment holes formed therein.

2. The radiation mask of claim 1 wherein the radiation blocking material is an X-ray absorbing material.

3. The radiation mask of claim 2 wherein the radiation transmitting material includes a silicon nitride membrane and the X-ray absorbing material is gold.

4. The radiation mask of claim 1 wherein the mask photoresist layer is elevated over the alignment structure area.

5. The radiation mask of claim 1 including additionally a first photoresist layer having first alignment holes formed therein, and alignment posts inserted into the first alignment holes and mask alignment holes to join the mask and the first photoresist layer to form a radiation mask assembly.

6. The radiation mask of claim 1 wherein there are at least two alignment structure areas positioned on the mask on opposite sides of the device area.

7. A method for making a radiation mask adapted to be aligned with a photoresist layer, comprising the steps of:
   (a) forming device and alignment structure areas made of a radiation transmitting material on a mask wafer;
   (b) forming in the device area a pattern of radiation blocking material defining a microstructure device and in the alignment structure area a pattern of radiation blocking material defining an alignment hole geometry;
   (c) attaching a mask photoresist layer to the mask over the alignment structure area;
   (d) exposing the mask photoresist layer to radiation through the pattern of radiation blocking material in the alignment structure area to make a selected portion of the mask photoresist layer corresponding to the alignment hole geometry subject to removal by a developer; and
   (e) developing the exposed mask photoresist layer to remove the selected portion thereof to form mask alignment holes therein.

8. The method of claim 7 wherein the radiation blocking material is an X-ray absorbing material and wherein the step of exposing the mask photoresist layer to radiation includes the step of exposing the mask photoresist layer to X-ray radiation.

9. The method of claim 7 wherein the step of attaching a mask photoresist layer to the mask includes the steps of attaching photoresist sheets to the mask outside of alignment structure membrane areas and attaching the mask photoresist layer to the photoresist sheets such that the mask photoresist layer is attached over the alignment structure membrane area and is separated from an alignment structure membrane.

* * * * *